United States Patent
Takasugi

(10) Patent No.: US 6,640,295 B2
(45) Date of Patent: *Oct. 28, 2003

(54) SEMICONDUCTOR CIRCUIT WITH ADDRESS TRANSLATION CIRCUIT THAT ENABLES QUICK SERIAL ACCESS IN ROW OR COLUMN DIRECTIONS

(75) Inventor: Atsushi Takasugi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 15 days.

This patent is subject to a terminal disclaimer.

(21) Appl. No.: 09/933,672

(22) Filed: Aug. 22, 2001

(65) Prior Publication Data

US 2002/0026557 A1 Feb. 28, 2002

Related U.S. Application Data

(63) Continuation of application No. 09/055,186, filed on Apr. 6, 1998, now Pat. No. 6,301,649.

(30) Foreign Application Priority Data

Apr. 7, 1997 (JP) .............................................. 9-088241

(51) Int. Cl.[7] .............................................. G06F 12/06
(52) U.S. Cl. ........................... 711/217; 711/5; 711/157; 345/540; 365/230.04
(58) Field of Search .............................. 711/5, 157, 217, 711/218; 345/536, 540, 543, 544, 569, 571; 365/221, 230.03, 230.04, 231, 238.5, 239

(56) References Cited

U.S. PATENT DOCUMENTS

| 5,497,351 | A | | 3/1996 | Oowaki ................. 365/230.03 |
| 5,561,777 | A | | 10/1996 | Kao et al. ....................... 711/5 |
| 5,598,374 | A | | 1/1997 | Rao ....................... 365/230.03 |
| 5,781,201 | A | | 7/1998 | McCormack et al. ........ 345/509 |
| 5,815,169 | A | | 9/1998 | Oda ........................... 345/517 |
| 5,850,483 | A | * | 12/1998 | Takabatake et al. ......... 382/233 |
| 5,924,111 | A | | 7/1999 | Huang et al. ................... 711/5 |
| 6,125,432 | A | * | 9/2000 | Hanami et al. ............. 711/157 |

* cited by examiner

*Primary Examiner*—Gary Portka
(74) *Attorney, Agent, or Firm*—Volentine Francos, PLLC

(57) ABSTRACT

In a semiconductor memory, memory banks each having memory cells are arranged in X and Y directions. Each of the memory banks include a Y decoder for selecting Y-direction addresses of the memory cells and an X decoder for selecting X-direction addresses of the memory cells, predicated on a memory having memory banks operable independent from one another. Items of data specified by a specified number of continuous X addresses and having the same Y addresses are successively written into or read from the memory cells arranged in the X direction, which are specified by X addresses corresponding to 1+knth (where k=0, 1, 2 . . . ) in one of the banks. After all the data have been written into or read from the specified memory cells, the corresponding data are successively written into or read from the memory cells specified by X addresses corresponding to 2+knth in another one of the banks.

15 Claims, 23 Drawing Sheets

SEMICONDUCTOR CIRCUIT WITH ADDRESS TRANSLATION CIRCUIT THAT ENABLES QUICK SERIAL ACCESS IN ROW OR COLUMN DIRECTIONS

CROSS REFERENCE TO RELATED APPLICATIONS

This is a continuation application of application Ser. No. 09/055,186, filed Apr. 6, 1998, now U.S. Pat. No. 6,301,649 B1, which is hereby incorporated by reference in its entirety for all purposes.

BACKGROUND OF THE INVENTION

This invention relates to a semiconductor memory device and a method of reading data from and writing data into the semiconductor memory device, and particularly to a memory device of a type wherein a method of reading data therefrom and writing data therein is contrived.

DESCRIPTION OF THE RELATED ART

One arbitrary screen of a CRT used for a general TV or panel or a PC (Personal Computer) is made up of a plurality of lines scanned over a fluorescent screen of a Braun tube in a transverse direction thereof. In the conventional system, one line comprises image information units (hereinafter called "pixels") of about 900 dots to 1000 dots. The number of lines constituting one screen commonly ranges from about 500 to 600. When a memory is used in a system (TV, CRT or the like) which handles image information, it is necessary to access line information at high speed. On the other hand, the line information is easy to treat with because of serial addresses to be incremented. Therefore, when one attempts to handle the line information in a commonly general-purpose DRAM (Dynamic Random Access Memory), a page mode for accessing a series of pieces of memory information selected by an arbitrary word line at high speed is often used.

Memories used except for the general-purpose DRAM include a field memory, a dedicated memory called "frame memory." These memories are capable of connecting a data register corresponding to one page to its corresponding bit line pair of the DRAM, transferring a series of plural memory information selected by a corresponding word line of the DRAM to their corresponding data register (or transferring write-completed data register information to a series of plurality of memories selected by their corresponding word lines) and providing a quick serial access. Thus, even the field memory or the frame memory serially accesses information (i.e., page information corresponding to one row) coupled to the same word line in a page mode as in the case of the aforementioned DRAM. Namely, a page mode (corresponding to a page mode (Enhanced Data Out: EDO) faster in speed in the recent DRAM) has heretofore been used in an image processing system using a TV and a CRT when used to access the line information.

The conventional page mode is used for various purposes such as a scan converter requiring an access (i.e., a serial access in a column direction) in a vertical direction, a noise filter, a matrix calculation, etc. In the conventional memory, however, the serial access in the column direction cannot be structurally performed at high speed although the serial access in the row direction can be executed at high speed. In the general-purpose DRAM, for example, an access clock frequency ranges from 15 ns to 20 ns upon an EDO mode corresponding to the present highest speed serial access mode (page access mode). However, since time is required between the rise to fall of a word line when it is desired to perform the serial access in the column direction, the access clock frequency results in a range of 120 ns to 150 ns.

A synchronous DRAM (or SDRAM), which has come into wide use recently, mostly takes a configuration in which memory units called "separately-accessible banks" are provided in plural form. A two-bank configuration is commonly used for the synchronous DRAM. Data on word lines (i.e., rows different from each other) different from each other every serial bit in a row direction can be taken out by using the two banks. However, even the memory having the two-bank configuration cannot obtain serial access to different word line information every bit. Since a succession of page access in a row direction is basically defined as a basic operation even in the case of the field memory used as a TV-dedicated memory, a high-speed serial access in a column direction cannot be implemented.

Thus, a plurality of line memories are electrically connected to a memory to realize a serial access in a column direction in an actually-available system. Namely, a problem arises in that attached parts called the line memories are needed and thereby the system will lead to an increase in cost.

SUMMARY OF THE INVENTION

An object of the present invention is to provide a memory device allowing only memories capable of providing quick serial access in a row direction to obtain quick serial access in a column direction without having to use other attached parts, and a method of writing data into and reading data from the memory device.

In the present invention, memory banks each having memory cells arranged in an X and a Y directions, Y decoder for selecting Y-direction addresses of the memory cells and X decoder for selecting X-direction addresses of the memory cells are predicated on a memory having n (where n: natural numbers) memory banks operable independent from one another.

Items of data specified by a (where a: natural numbers) continuous X addresses and having the same Y addresses are successively written into or read from the memory cells arranged in the X direction, which are specified by X addresses corresponding to 1+knth (where k=0, 1, 2, . . . ) in one of the banks. After all the data have been written into or read from the specified memory cells, the corresponding data are successively written into or read from the memory cells specified by X addresses corresponding to 2+knth (where k=0, 1, 2, . . . ) in another one of the banks.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A background part of the present invention will be described before the description of preferred embodiments.

Any of motion pictures and freeze-frame pictures on a TV screen and a PC screen is basically made up of a sequence of still-frame screens. One screen thereof is called "frame."

A sequence of image bit information corresponds to horizontal-direction scanning lines. One frame is made up of a set or collection of the lines. When physical addresses for a memory and a TV screen (or PC screen) are placed in a one-to-one correspondence with each other, a system can be easily designed. Here, the physical addresses for the memory and the TV screen (or PC screen) are considered to be in the one-to-one correspondence with each other (the correspondence of addresses and memory units are considered to be as the correspondence between image dots on the TV screen or PC screen and addresses).

Figure 2:
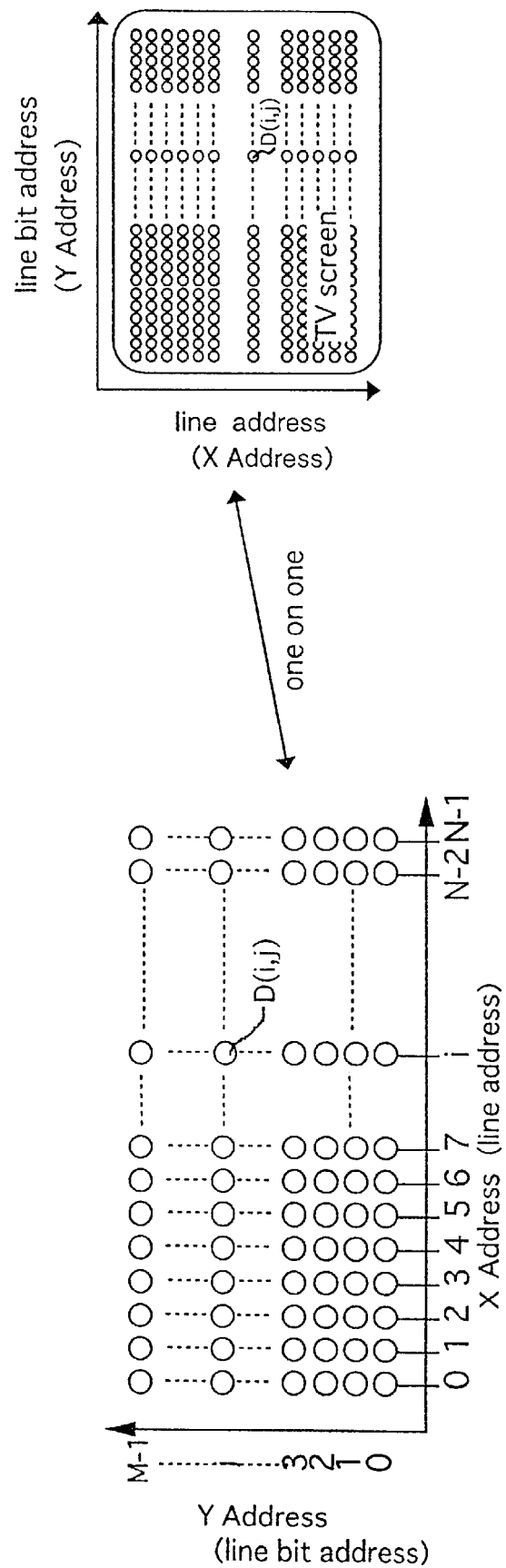
FIG. 2 is a diagram showing a memory comprised of a collection of memory units selected by X addresses of X=0 through N−1 and Y addresses of Y=0 through M−1.

FIG. 2 is a diagram showing a memory comprised of a collection of memory units unequivocally selected by X addresses of X=0 through N−1 and Y addresses Y=0 through M−1. In the subsequent description, the memory shown in FIG. 2 will be considered as an illustrative example. Incidentally, information stored in a memory unit selected by an address (Xi, Yj) will be defined as D(Xi, Yj).

Since the line scanning is normally easy to correspond to a memory's page mode access, the direction of each line corresponds to an X direction (row direction) of the memory and line bit addresses are respectively set by Y addresses. Namely, line addresses correspond to the X addresses respectively and addresses for respective bits in lines are equivalent to the Y addresses (i.e., it is to be noted that X and Y of a memory and an image are opposed to each other for a physical image). A continuous serial data access to the number of bits (equivalent to the number of bits corresponding to one page) corresponding to one row of an ordinary general-purpose memory or above cannot be made to the ordinary general-purpose memory. This access can be made to a memory having a memory array comprised of a plurality of banks, which is called "SDRAM or field memory (or frame memory)". This is because if there are two banks or more, an access to the next page can be prepared during a data access corresponding to one page by way of background. However, a high-speed serial access in a column direction cannot be performed as described previously.

In the present invention, a memory comprised of a plurality of banks utilizes bank interleaving and applies an ability to obtain a high-speed serial access to continuous address bits on different rows (word lines) to thereby operate write addresses. As a result, the continuous high-speed serial access in the column direction can be performed by the memory.

In the present invention, the rearrangement or sorting of addresses on an actual memory device having a plurality of banks allows a conventionally-impracticable high-speed serial page access in the column direction to image data or the like (on a two-dimensional plane) specified by the conventional X and Y addresses as well as the conventional high-speed serial page access thereto in the row direction. A method of implementing a high-speed serial data access by an SDRAM having two banks will be explained here with reference to FIG. 2.

Figure 3:
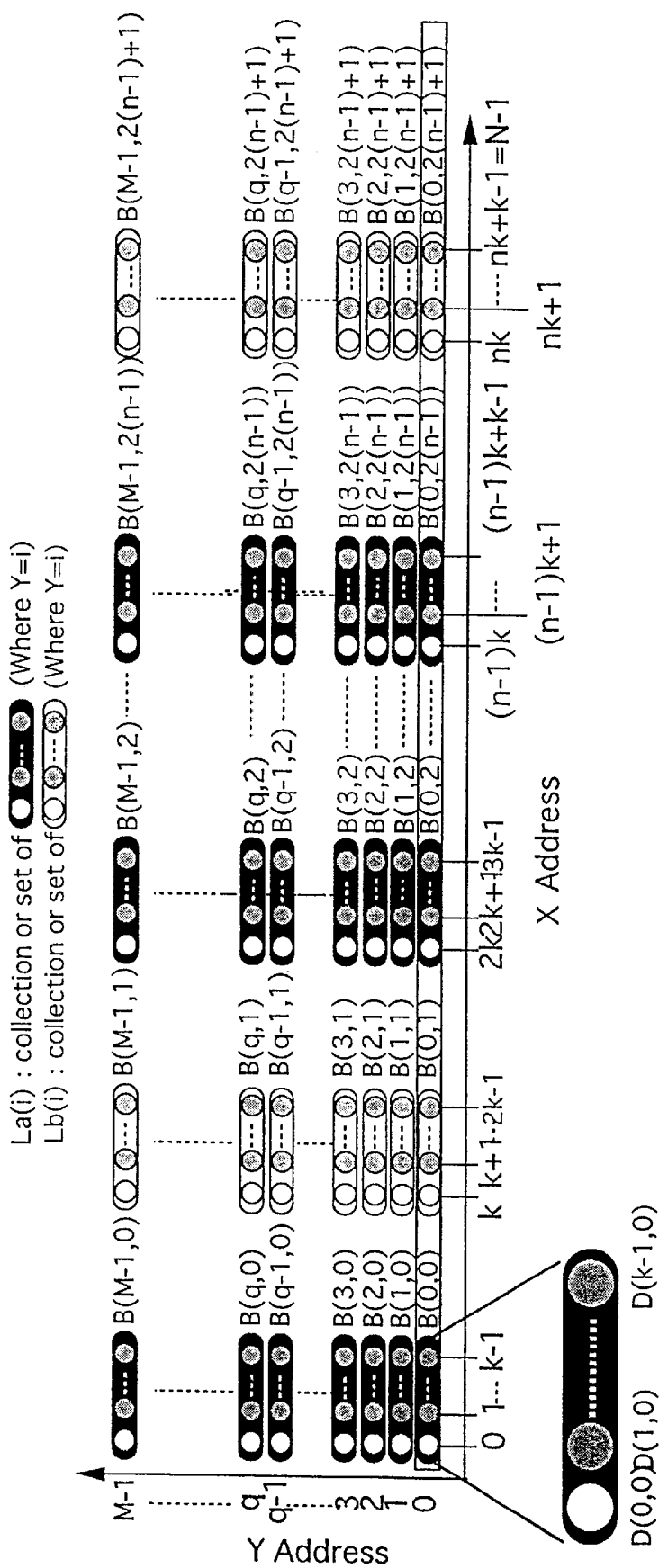
FIG. 3 is a diagram showing memory units collected or compiled by adjoining k in an X direction.

In the TV screen and the PC's ORT screen as described previously, the X addresses correspond to the line addresses and the Y addresses correspond to the line bit addresses, respectively. FIG. 2 may be considered to be one wherein the screen is shifted by 90 degrees. The relationship between the memory units and the addresses shown in FIG. 2 remains unchanged. As shown in FIG. 3, Y addresses are constant and memory units are collected or compiled by adjoining k (where k: arbitrary integers and will be omitted subsequently) in an X direction. As a result, compiled small collections or sets will be defined as B(i, j) (where i and j:

arbitrary integers and will be omitted subsequently). Thus, the X direction is divided into (N−1)/k. Now consider where when i is kept constant, sets of B(i, j) at the time that j are odd, and defined as La(i) and sets at the time that j are even, are defined as Lb(i) in FIG. 3. When j of B(i, j) are even, sets of B(i, j) are shaded and the sets remain surrounded by frames when j of B(i, j) are odd, respectively as shown in FIG. 3. Thus, La(i) correspond to shaded sets of B(i, j) at the time that i are constant, whereas Lb(i) correspond to frame-surrounded sets of B(i, j) at the time that i are constant. For example, the sum of La(0) and Lb(0) is equivalent to a set of memory units having addresses of Y=0.

Figure 1:
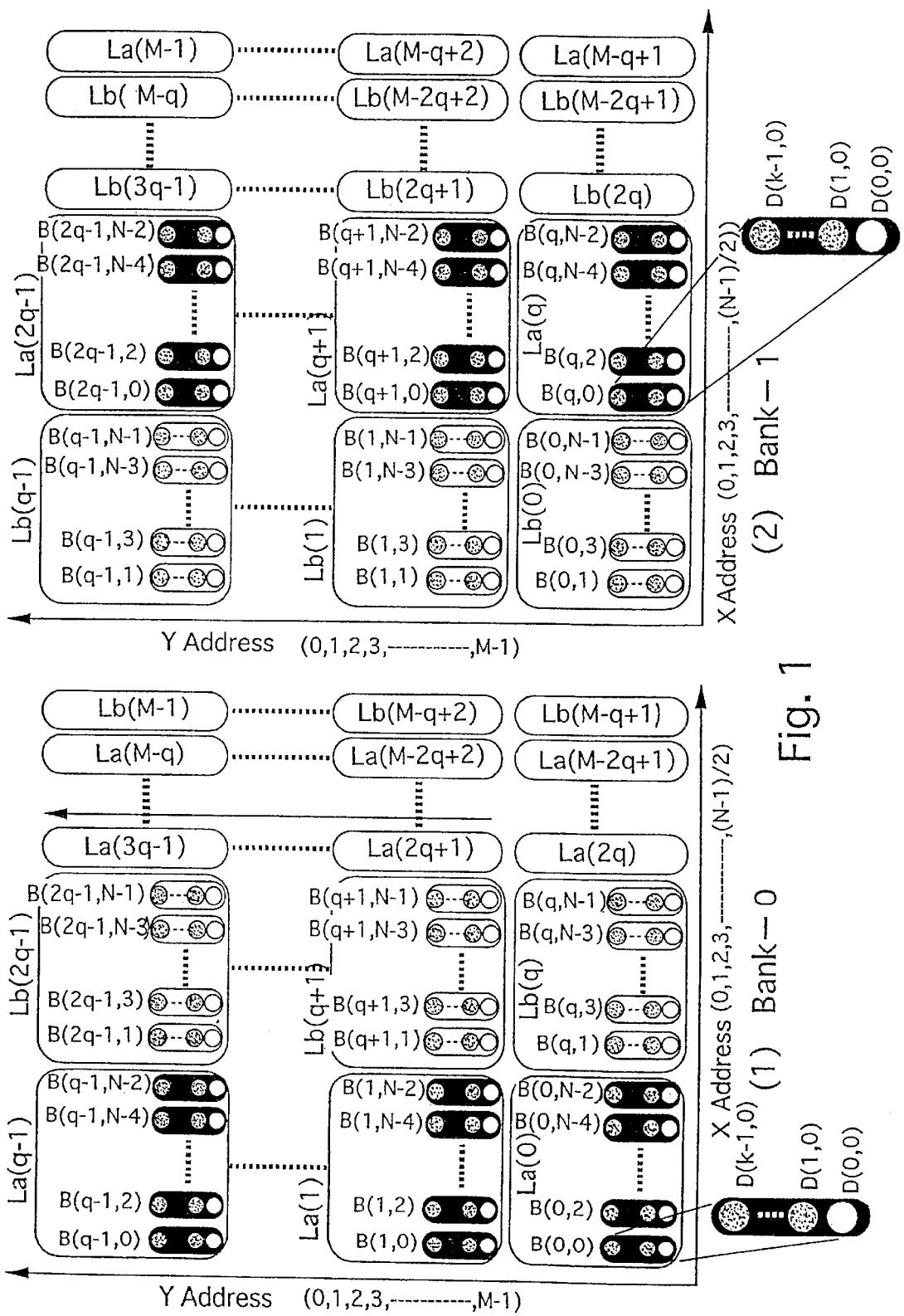
FIG. 1 is a diagram showing a memory plane of a memory having a memory array comprised of two banks.

FIG. 1 shows a memory plane of a memory having a memory array comprised of two banks. The small sets B(i, j) of the memory units shown in FIG. 3 are re-arranged in a bank-0 and a bank-1 as shown in FIG. 1. La(i) and Lb(i) after the re-arrangement of B(i, j) are arranged as shown in FIG. 1. B(i, j) originally correspond to k-bit information continuous in the X direction. However, the arrangement of B(i, j) in the Y direction is a large feature.

In FIG. 1, the numbers of La(i) and Lb(i) are respectively arranged as q in the Y direction. Namely, since the maximum addresses of the bank-0 and the bank-1 in the Y direction are respectively M−1, B(i, j) provided by k bits in the Y direction are arranged as q=(M−1)/k in a page direction. As also shown in FIG. 1, La(0) through La(q−1) are arranged in a first row in the Y direction of the bank-0, and La(q) through La($2q$−1) are arranged in a second row of the bank-i (it is a key point that they are not arranged in the bank-0 identical to La(0) through La(q−1)). Similarly, La($2q$) through La($3q$−1) are arranged in a third row of the bank-0. On the other hand, Lb(0) through Lb(q−1) are arranged in a first row of the bank-1 and Lb(q) through Lb($2q$−1) is arranged in a second row of the bank-0. Similarly, Lb($2q$) through Lb($3q$−1) are arranged in a third row of the bank-1.

With such regularity, the memory information and the addresses are re-arranged in the form of La(i) and Lb(i) as shown in FIG. 1 (i.e., D(i, j) shown in FIG. 2 are written into the memory having the two-bank configuration in accordance with FIG. 1). As a result, a high-speed serial access in a column direction can be made as well as a high-speed serial access in a row direction.

A method of writing data into a memory according to a method employed in a first embodiment of the present invention and a method of reading same therefrom will next be explained. A description will be made of an accessing method at the time that a relationship of position between the addresses and the memory shown in FIG. 2 is re-arranged for the memory having the two-bank configuration according to the method of the present invention as shown in FIG. 1 for convenience of illustration.

1) Description of high-speed serial access in row direction:

1-a) Description of writing method:

The X and Y address and memory information shown in FIG. 2 will be explained in parts as three cases: 1-a-1): where a line of X=0 in the address map of the memory shown in FIG. 2 is serially accessed from Y=0, 1-a-2): where a line of X=k−1 in the address map of the memory shown in FIG. 2 is serially accessed from Y=0, and 1-a-3): where a line of x=k in the address map of the memory shown in FIG. 2 is serially accessed from Y=0.

Figure 4:
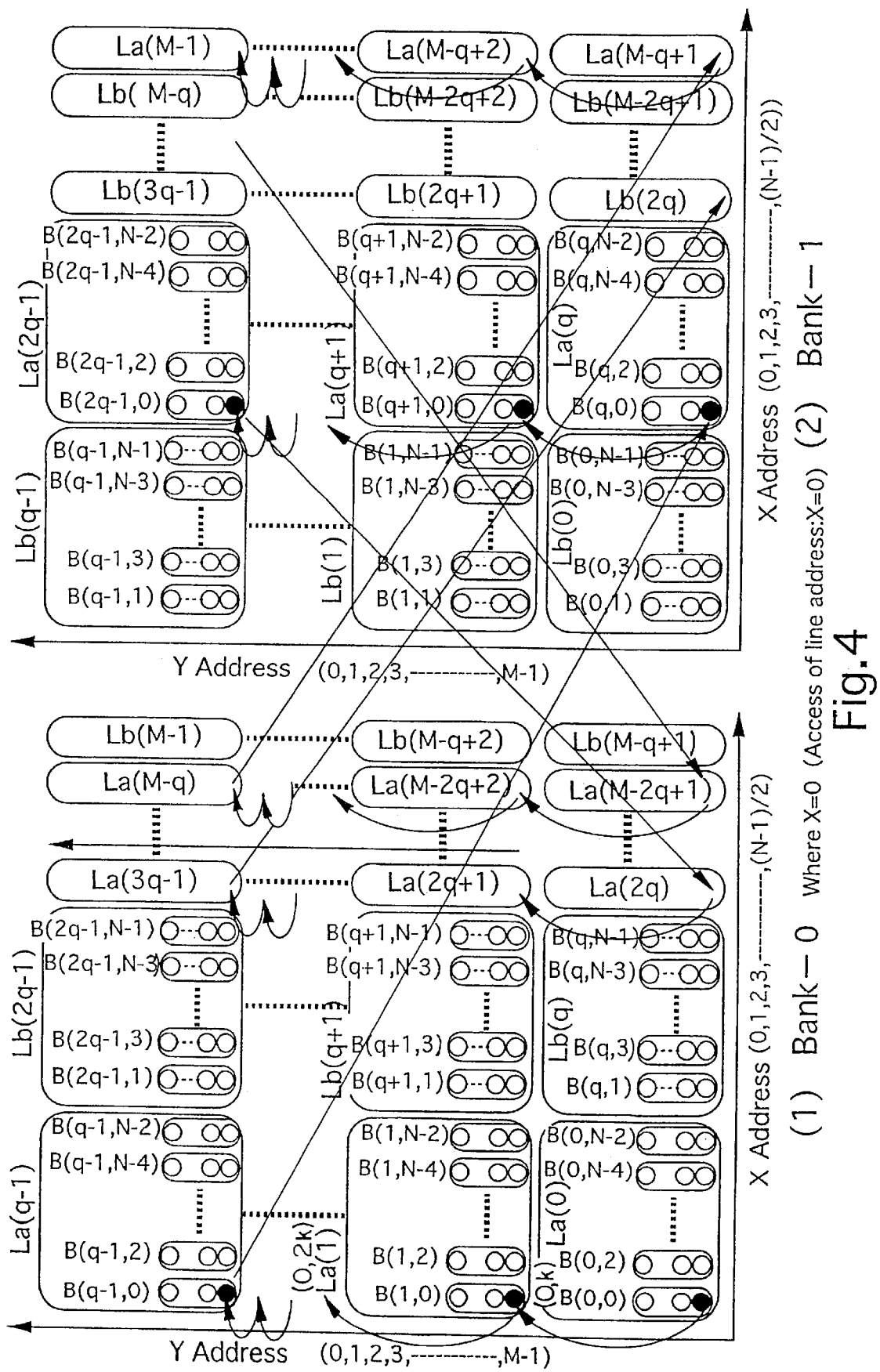
FIG. 4 is a diagram showing an access to the line of X=0 in the address map of the memory shown in FIG. 2.

1-a-1) Description of an access to the line of X=0 in the address map of the memory shown in FIG. 2:

As shown in FIG. 4, D(0, 0) is first written into the leading bit in B(0, 0) of La(0). D(0, 1) is secondly written into the leading bit in B(1, 0) of La(1). Further, D(0, 2) is thirdly written into the leading bit in B(2, 0) of La(2). The same operation as described above is repeated and thereafter D(0, q−1) is written into the leading bit in B(q−1, 0) of La(q−1) as the qth. Thus, the serial bits on the line of X=0 in the address map of the memory shown in FIG. 1 are written by q bits.

While the write operation is being performed at the above bank-0, the bank-1 is ready for its writing. Getting ready for the writing includes precharging one of the bit lines of the bank-1.

Next, D(0, q) is written into the leading bit of B(q, 0) of La(q) in the bank-1 as the q+1th. The q+2th writing is as follows: D(0, q+1) is written into the leading bit of B(q+1, 0) of La(q+1). The same operation as described above is repeated and thereafter D(0, $2q$−1) is written into the leading bit of B($2q$−1, 0) of La($2q$−1) as the $2q$th. As described above, serial bits on the line of X=0 in the address map of the memory shown in FIG. 1 are further written by q bits.

While the write operation at the above bank-1 is being performed, the bank-0 is ready for its writing.

As described in the write operations at the bank-0 and bank-1, their operations are further continuously performed up to La(M−1) as indicated by arrows in FIG. 4. It is thus possible to write the serial bits on the line of X=0 in the address map of the memory shown in FIG. 2 at high speed (provide a page access in the row direction).

While the writing of serial bits on a line of X=1 in the address map of the memory shown in FIG. 2 is performed in a manner similar to the above operation, the present bit writing is different from the above writing in that items of data are written into second bits of B(r, 1) (where r: arbitrary integers). The subsequent processing is performed in the same manner as described above up to kth bits. However, a description will be made of X=k−1 indicative of the final bit for reference purposes.

Figure 5:
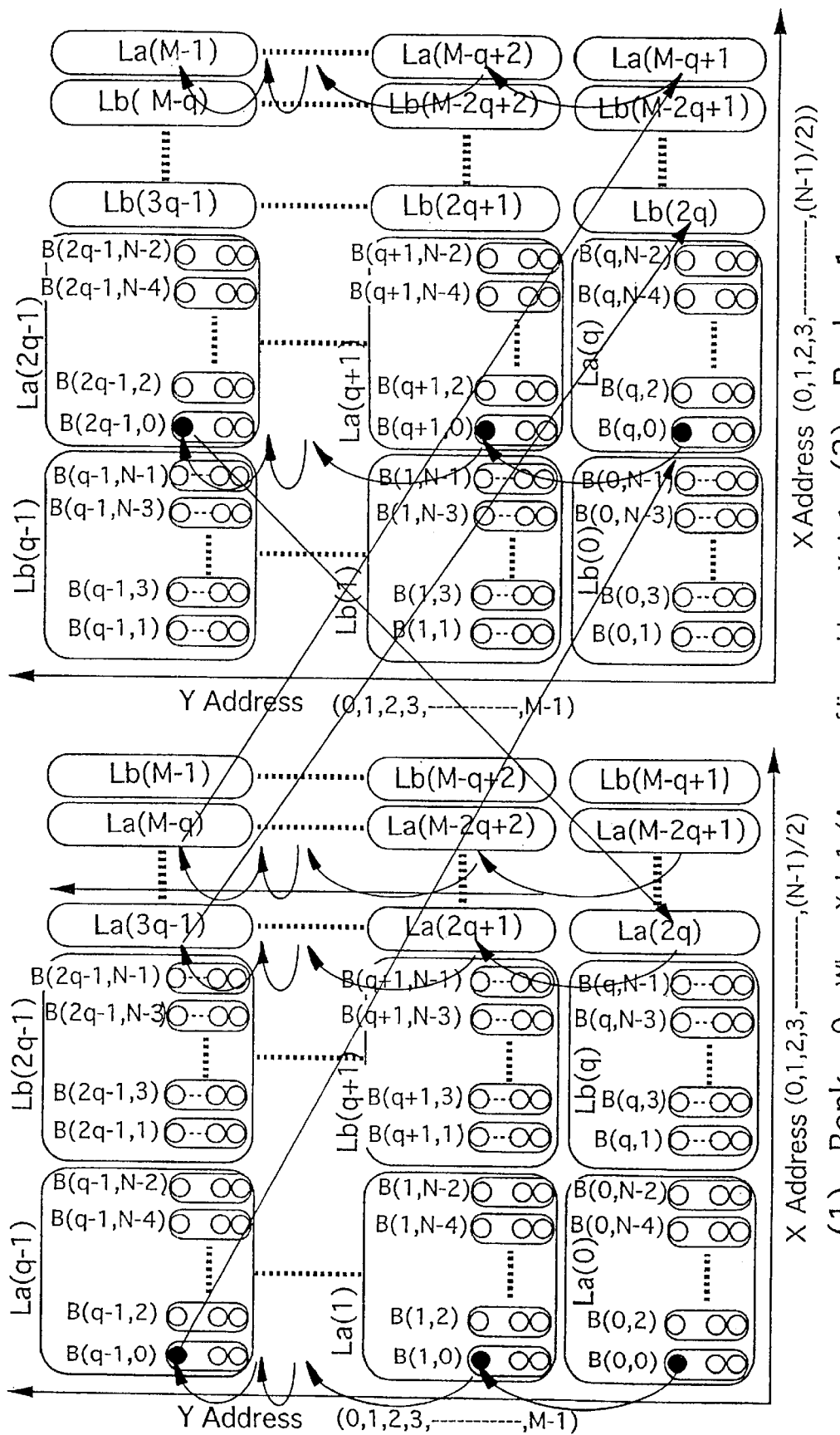
FIG. 5 is a diagram showing an access to a line of X=k−1 in the address map of the memory shown in FIG. 2.

1-a-2) Description of an access to a line of X=k−1 in the address map of the memory shown in FIG. 2:

As shown in FIG. 5, D(k−1, 0) is first written into a kth bit in B(0, 0) of La(0). Secondly, D(k−1, 1) is written into a kth bit in B(1, 0) of La(1). Thirdly, D(k−1, 2) is written into a kth bit in B(2, 0) of La(2). The same operation as referred to above is repeated and thereafter D(k−1, q−1) is written into a kth bit in B(q−1, 0) of La(q−1) as the qth. Thus, the serial bits on the line of X=k−1 in the address map of the memory shown in FIG. 1 are written by q bits.

While the write operation is being performed at the above bank-0, the bank-1 is ready for its writing.

Next, D(k−1, q) is written into a kth bit of B(q, 0) of La(q) in the bank-1 as the q+1th. The q+2th writing is as follows: D(k−1, q+1) is written into a kth bit of B(q+1, 0) of La(q+1). The same operation as described above is repeated and thereafter D(k−1, $2q$−1) is written into a kth bit of B($2q$−1, 0) of La($2q$−1) as the $2q$th. As described above, serial bits on the line of X=k−1 in the address map of the memory shown in FIG. 5 are further written by q bits.

While the write operation at the above bank-1 is being performed, the bank-0 is ready for its writing.

The write operations described in the bank-0 and bank-1 are continuously performed up to La(M−1) as indicated by arrows in FIG. 5. It is thus possible to write the serial bits on the line of X=k−1 in the address map of the memory shown in FIG. 2 at high speed (provide a page access in the row direction).

Figure 6:
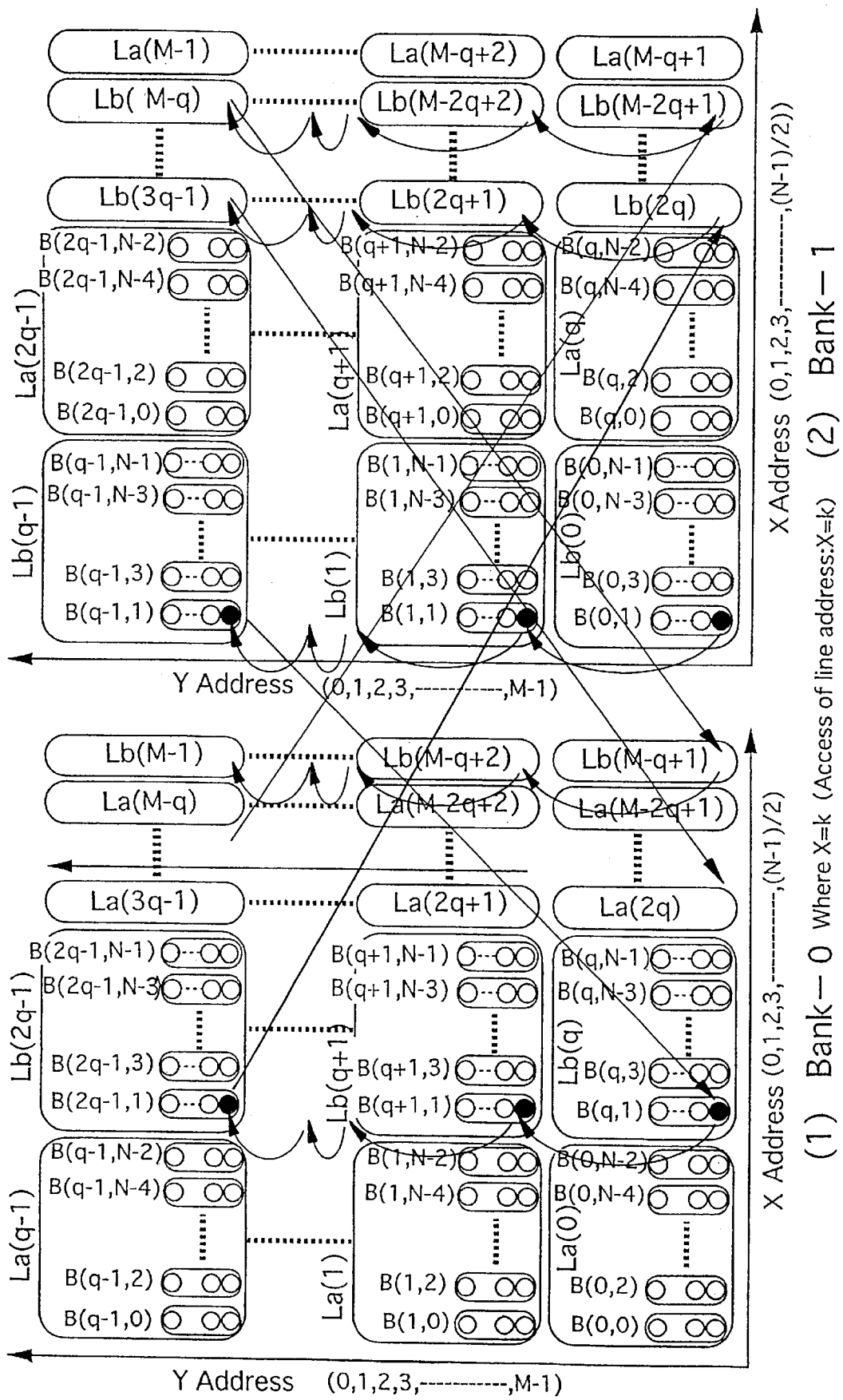
FIG. 6 is a diagram showing an access to a line of X=k in the address map of the memory shown in FIG. 2

1-a-3) Description of an access to a line of X=k in the address map of the memory shown in FIG. 2:

As shown in FIG. 6, D(k, 0) is first written into the leading bit in B(0, 1) of Lb(0) in the bank-1. Secondly, D(k, 1) is written into the leading bit in B(1, 1) of Lb(1). Thirdly, D(k, 2) is written into the leading bit in B(2, 1) of Lb(2). The same operation as referred to above is repeated and thereafter D(k, q−1) is written into the leading bit in B(q−1, 1) of Lb(q−1) as the qth. Thus, the serial bits on the line of X=0 in the address map of the memory shown in FIG. 5 are written by q bits.

While the write operation is being performed at the above bank-0, the bank-1 is ready for its writing.

Next, D(k, q) is written into the leading bit of B(q, 1) of Lb(q) in the bank-0 as the q+1th. The q+2th writing is as follows: D(k, q+1) is written into the leading bit of B(q+1, 1) of Lb(q+1). The same operation as described above is repeated and thereafter D(k, $2q-1$) is written into the leading bit of B($2q-1$, 1) of Lb($2q-1$) as the $2q$th. Thus, serial bits on the line of X=0 in the address map of the memory shown in FIG. 2 are further written by q bits.

While the write operation at the above bank-1 is being performed, the bank-0 is ready for its writing.

The write operations at the bank-0 and bank-1 are continuously performed up to Lb(M−1) as indicated by arrows in FIG. 6. It is thus possible to write the serial bits on the line of X=0 in the address map of the memory shown in FIG. 5 at high speed (provide a page access in the row direction).

While the writing in FIG. 6 of serial bits on a line of X=k+1 in the address map of the memory shown in FIG. 2 is performed in a manner similar to the above operation, the present bit writing is different from the above writing in that items of data D are written into second bits of B(r, 1) (where r: arbitrary integers). The subsequent processing is performed in the same manner as described above up to $2k$th bits.

1-b) Description of reading method:

The read operation can be performed in exactly the same manner as the write operation by reading data in the same order as is the case previously described in the write operation. Since another bank reading called "bank interleaving" can be set up during an access to one bank in particular, a continuous high-speed serial access can be performed.

Thus, how to perform the reading and writing for the high-speed serial access in the row direction in the present invention has been described in detail. Although the serial access has been started from the address of Y=0 in the address map of the memory shown in FIG. 1 for convenience of illustration, it is needless to say that the present access may be started from a given address.

Figure 7:
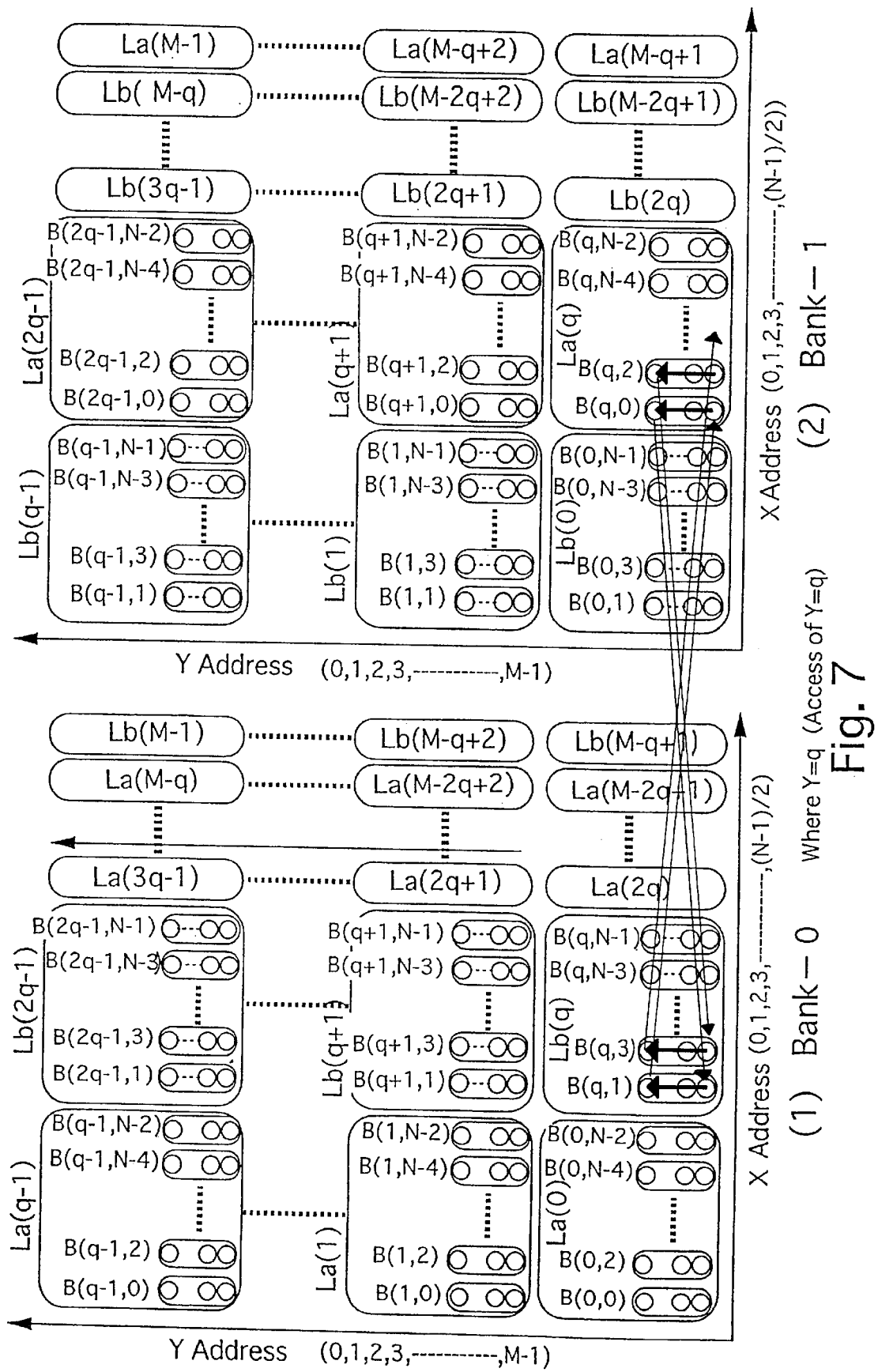
FIG. 7 is a diagram showing an order of a serial access in a column direction of Y=q in the address map of the memory shown in FIG. 2.

2) Description of high-speed serial access in column direction:

A description will be made of how to perform the high-speed serial access in the column direction according to the present invention. The order of a serial access in a column direction of Y=q in the address map of the memory shown in FIG. 2 is shown in FIG. 7 on the track of arrows as an illustrative example. The serial access can be started from a given address. However, now consider where the access is made serially from X=0 in FIG. 2 for simplification, The access is similarly done even in the case of the write and read operations. The access for the read operation will be explained below.

First of all, according to the present invention, the leading access bit is equivalent to data D(0, q) of Y=q and X=0 in FIG. 2 and corresponds to the leading bit in B(q, 0) of La(q) in the bank-1. This D(0, q) will first be read as the leading bit. Similarly, the next read data D(i, q) is equivalent to data positioned next to 0(0, q) in B(q, 0) of La(q) in the bank-1. This data is read as the second read data. Similarly, the read data D(2, q) after 0(1, q) corresponds to data located next to D(i, q) in B(q, 0) of La(q) in the bank-1. Thus, since the leading bit to kth read data D(k−1, q) are serially arranged in B(q, 0) of La(q) in the bank-1, the total k bits in the column direction can be serially accessed at high speed over the range of D(0, q) to D(k−1, q) in accordance with a circuit operation similar to the page mode (high-speed serial access) in the row direction.

During the access in the bank-1, a preparation for an access to B(q, 1) in Lb(q) of the bank-0 is done. Described specifically, a word line in the bank-0 corresponding to B(q, 1) is started up. Thus, the serial access is sequentially performed even upon switching from the bank-1 to the bank-0.

The leading bit data of B(q, 1) in Lb(q) of the bank-0 corresponds to D(k, q) and is read following kth data as k+1th serial read data in the column direction. In a manner similar to the access in the bank-1, the total k bits in the column direction can be serially accessed at high speed over the range of D(k, q) to D($2k-1$, q). Namely, since the k+1th to $2k$th read data D($2k-1$, q) are serially arranged in B(q, 1) of Lb(q) in the bank-0, the total k bits in the column direction can be serially accessed at high speed over the range of D(k, q) to D($2k-1$, q) in accordance with a circuit operation similar to the page mode (high-speed serial access) in the row direction.

During the access in the bank-0, a preparation for an access to B(q, 2) in La(q) of the bank-1 is performed. Described specifically, a word line in the bank-1 corresponding to B(q, 2) is started up. Thus, the serial access is sequentially performed even upon switching from the bank-0 to the bank-1.

The quick serial read operation in the column direction can be carried out by repeating the similar operations in the bank-0 and the bank-1 subsequently as indicated by arrows in FIG. 7. In the memory device according to the present invention, the items of data in which the addresses in the column direction are continuous, are arranged in the row direction and the items of data in which the addresses in the next column direction of the opposite bank are continuous, are ready for their accesses. Therefore, an intermission-free high-speed serial access can be implemented.

A specific embodiment will next be described by a simple example of 4×4 blocks.

Figure 8:
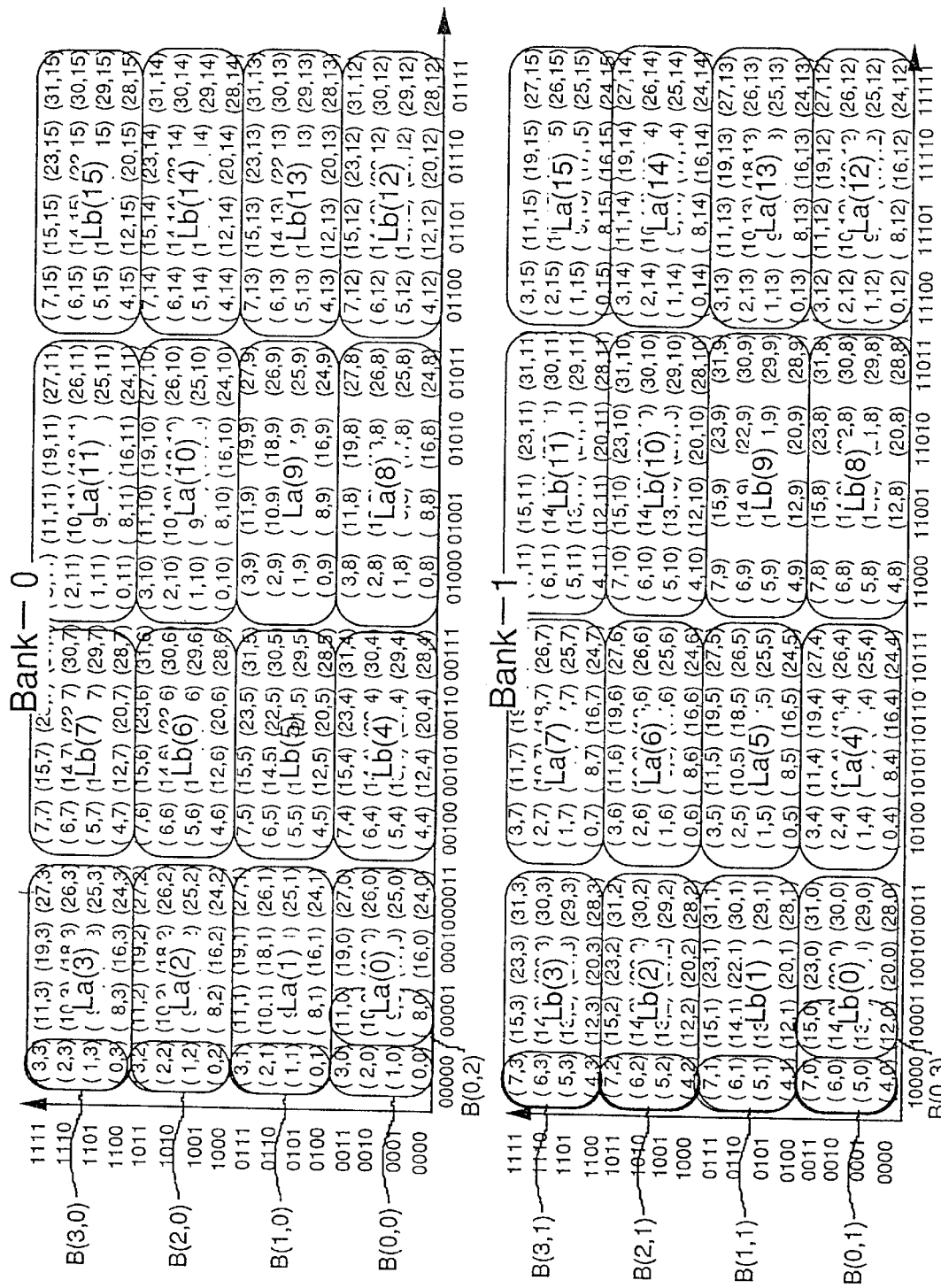
FIG. 8 is a diagram showing a memory map having a capacity of 512 bits.
Figure 10:
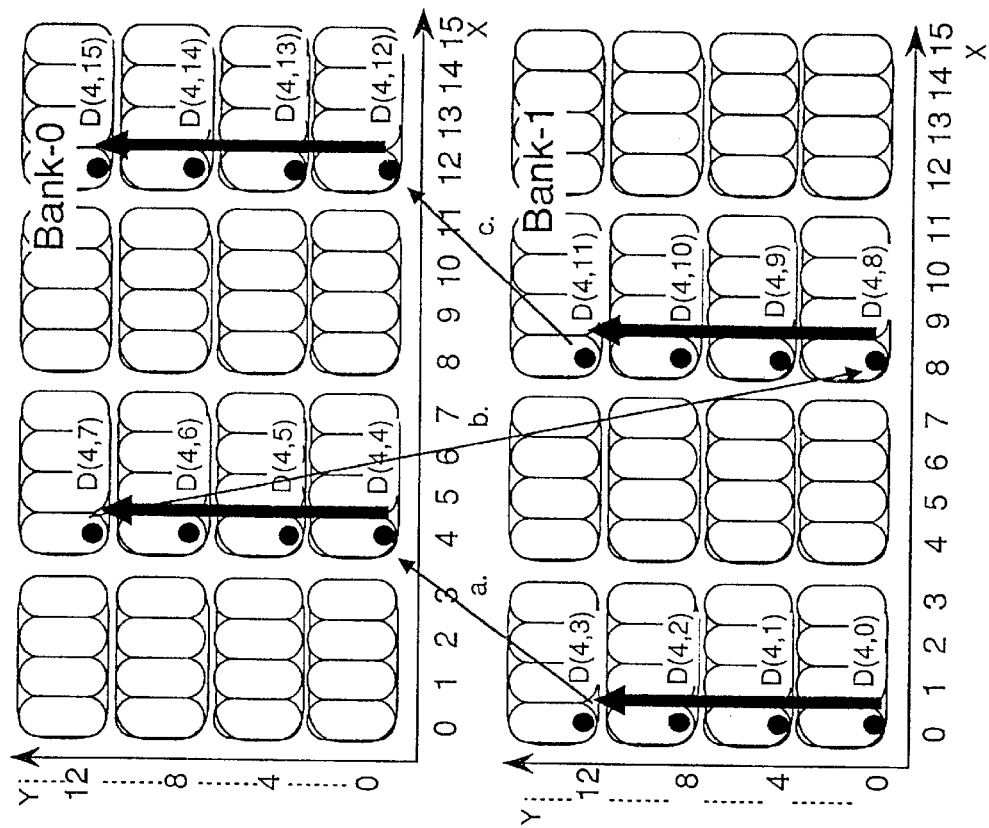
FIGS. 9 through 12 are diagrams showing serial accesses in the row direction in different locations to be accessed.
Figure 9:
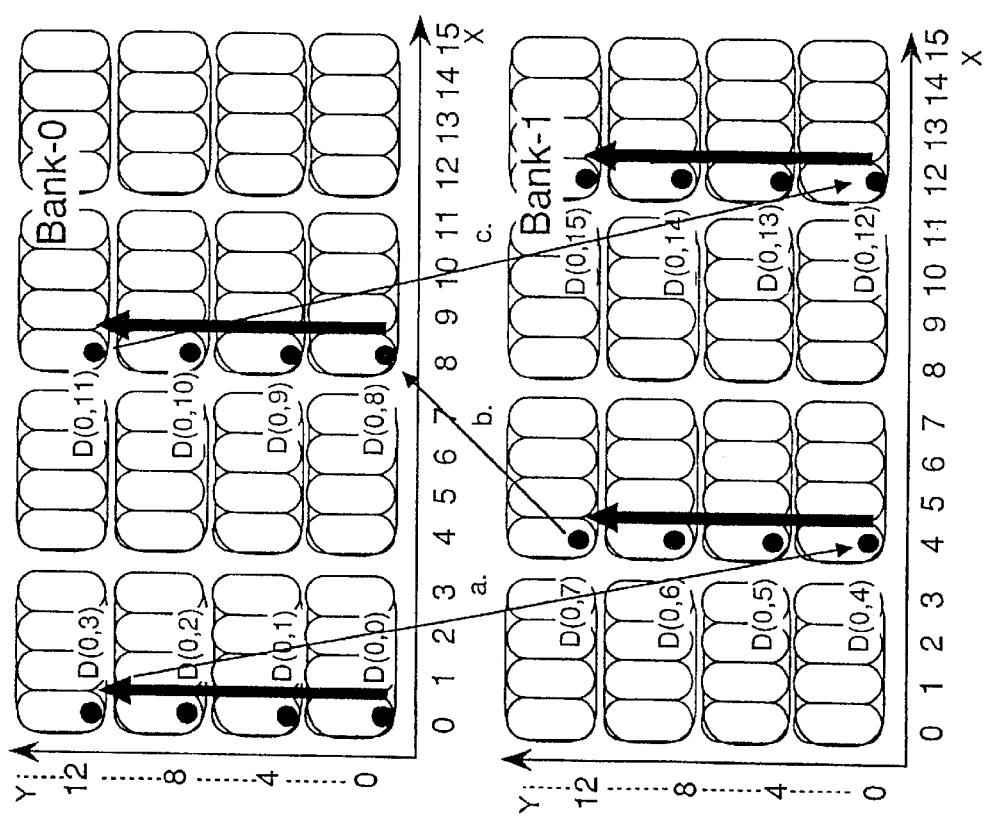
Figure 12:
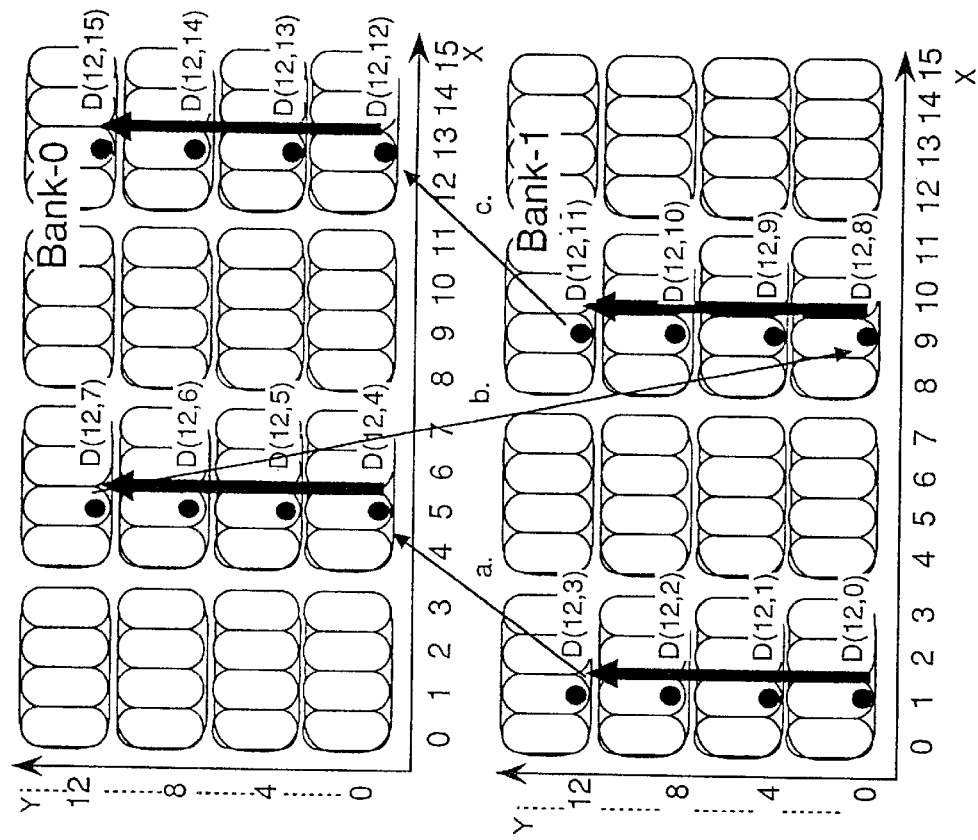
Figure 11:
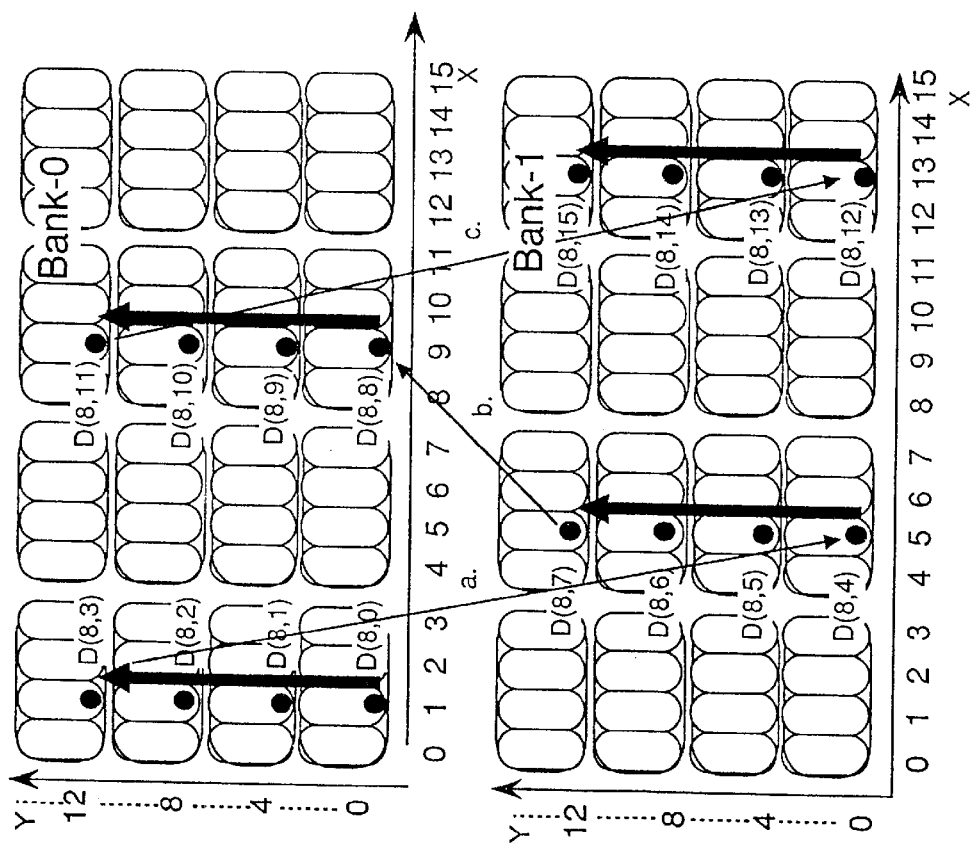

FIG. 8 is a diagram showing the correspondence of FIG. 1 and an example of a memory having a capacity of 512 bits. A drawing (corresponding to an example of a line access of X=0 in FIG. 2) corresponding to FIG. 4 referred to above is shown in FIG. 9. Further, a drawing (corresponding to an example of a line access of X=4 in FIG. 2) is illustrated in FIG. 10. Moreover, an example of a line access of X=8 in FIG. 2 and an example of a line access of X=12 in FIG. 2 are shown in FIGS. 11 and 12 respectively.

Since the serial accesses in the row directions are different from each other in locations to be accessed in FIGS. 9 through 12 and similar in operation to each other, the example shown in FIG. 9 will be explained as a typical one.

D(0, 0) (which is specified by an X address 00000 and a Y address 0000) is first written into the leading bit in B(0, 0) of La(0) shown in FIGS. 8 and 9. Secondly, D(0, 1) is written into the leading bit in B(1, 0) of La(1). Thirdly, D(0, 2) is written into the leading bit in B(2, 0) of La(2). Further, D(0, 3) is written into the leading bit in B(3, 0) of La(3) as the fourth. Serial bits on a line of X=00000 in an address map of the memory shown in FIG. 8 are written by four bits in this way.

The bank-1 is ready for its writing during the above write operation in the bank-0. Described specifically, a word line of X=10100 in the bank-1 is started up.

D(0, 4) is written into the leading bit in B(4, 0) of La(4) as the fifth. As the sixth writing, D(0, 5) is written into the leading bit in B(5, 0) of La(5). The similar operation is repeated and thereafter D(0, 7) is written into the leading bit in B(7, 0) of La(7) as the eighth. Thus, serial bits on the line of X=10100 in the address map of the memory shown in FIG. 8 are further written by four bits.

The bank-0 is ready for its writing during the above write operation in the bank-1. Described specifically, a word line of X=01000 in the bank-0 is started up.

Further, the write operations described in the bank-0 and bank-1 are sequentially performed until La(15) as indicated by arrows in FIG. 9. It is thus possible to write the serial bits arranged in the row direction in the address map of the memory shown in FIG. 8 at high speed (provided a page access in the row direction).

FIGS. 10 through 12 show the cases where X=4, X=8 and X=12, respectively. Since the operations shown in FIGS. 10 through 12 are similar to the operation shown in FIG. 9, the explanations are omitted.

The operation of serially accessing serial bits in a column direction by the embodiment of FIG. 8 will next be described.

Figure 13:
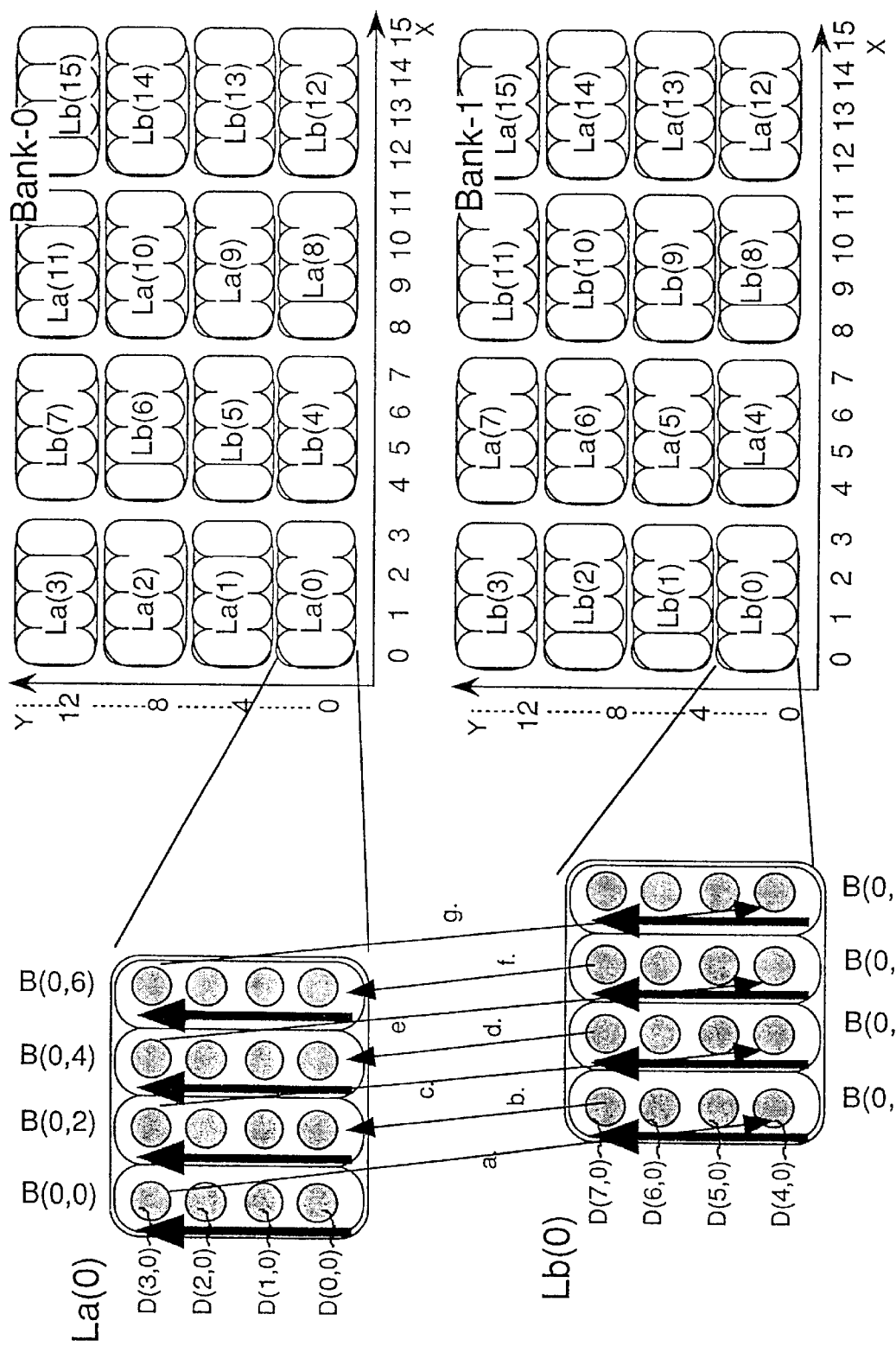
FIG. 13 is a diagram showing an example of a line access of X=0 to X=15 in FIG. 8 at Y=0 as an example of the serial access in the column direction.

FIG. 13 shows an example of a line access of X=0 to X=15 in FIG. 8 at Y=0 as an example of the serial access in the column direction. In FIG. 13, all of the bits of Y=0 are located in the collections or sets of La(0). The serial access is started from the leading bit D(0, 0) in B(0, 0) of La(0) in a bank-0 and made up to D(3, 0) in accordance with arrows in FIG. 13. As indicated by an arrow a in FIG. 13, D(4, 0) in B(0, 1) of Lb(0) in a bank-i is accessed. After the access has been made up to D(7, 0), D(8, 0) in B(0, 2) of La(0) is continuously accessed in accordance with an arrow k in FIG. 13. In accordance with the similar operations subsequently, the serial access is sequentially performed to reach D(15, 0).

Since the bank-0 and the bank-1 are alternately accessed even in the case of the serial access in the column direction, a high-speed access can be achieved as in the case of the high-speed access to the serial bits in the row direction.

A circuit of a semiconductor memory device according to the invention of the present application will next be explained.

Figure 14:
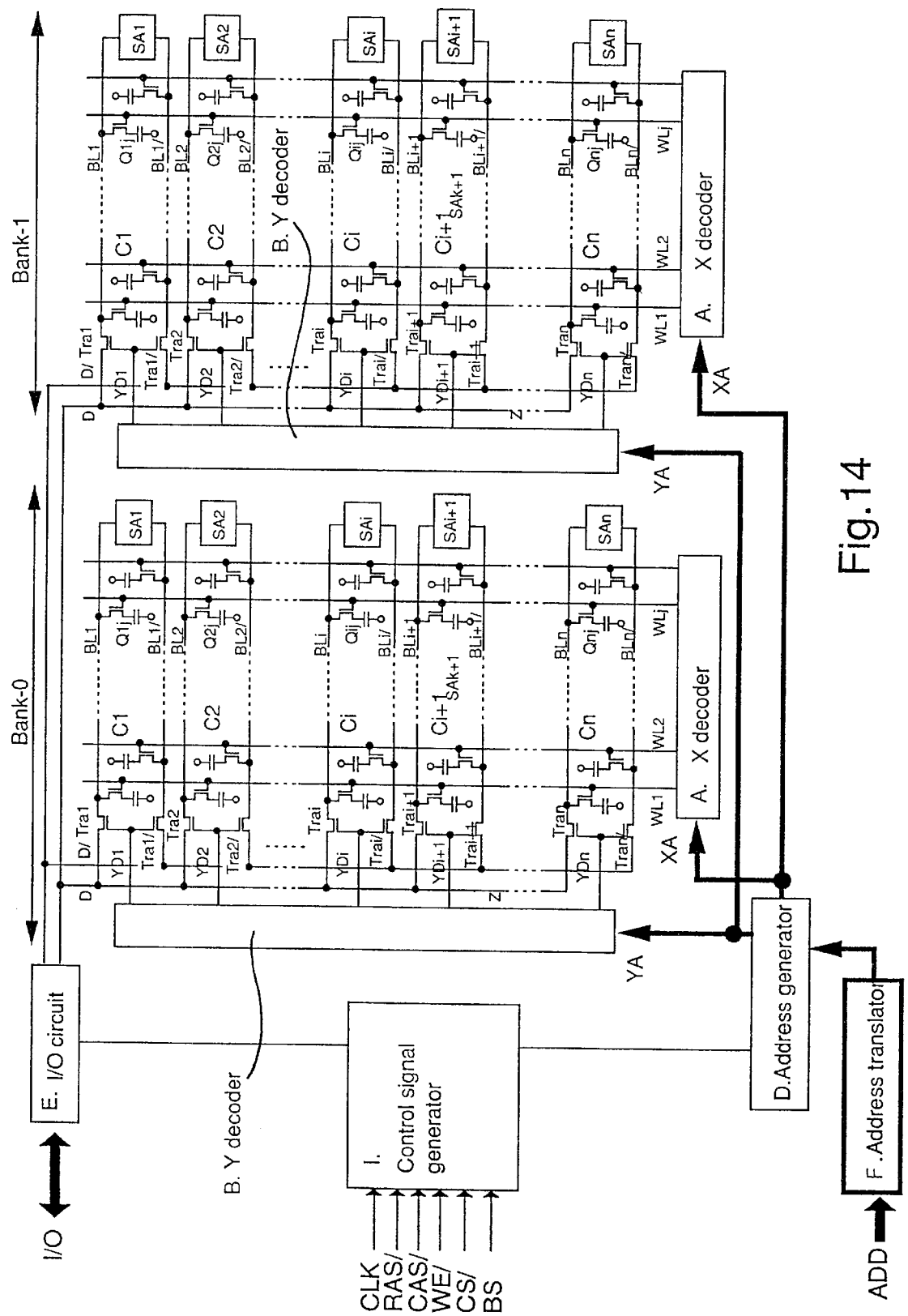
FIG. 14 is a circuit diagram showing a first embodiment of the semiconductor memory device according to the present invention.

FIG. 14 is a circuit diagram showing a first embodiment of the semiconductor memory device according to the present invention.

In a memory bank-0 and a memory bank-1, a plurality of memory cell units Qij (where i=I through n and j=I through m: these will be omitted subsequently) each comprising a memory capacitor and a transistor are electrically connected to bit line pairs BLi and BLi/. The bit line pairs BLi and BLi/ are respectively electrically connected to sense amplifiers SAi and opening/closing transistors Trai and Trai/ respectively electrically connected to data bus pairs. Respective ones of the bit line pairs constitute column units Ci.

Each of the memory bank-0 and the memory bank-1 comprises an X decoder A for selecting an arbitrary word line WLj electrically connected to any of the memory cell units Qij in response to an X address XA generated from an address generator D, a Y decoder B for selecting an arbitrary column unit Ci in response to an Y address YA generated from the address generator D, and a plurality of column unit groups.

An input/output circuit E having an I/O terminal is electrically connected to the data bus pairs so as to perform a common input/output operation between the bank-0 and the bank-1.

An address ADD is inputted to an address converting or translator F for performing address conversion employed in the present invention already described in detail. The address converting circuit F inputs a converted address to the address generator D. A clock signal CLK, a check select signal CS/, a row address strobe signal RAS/, a column address strobe signal CAS/, a write enable signal WE/, a bank select signal BS (handled in the same manner as the address) and an input address signal ADD are inputted to a control signal generator I. The control signal generator I generates signals for controlling all the memory operations starting with the address generator D and the input/output circuit E. The detailed description of the signals will be omitted in the present embodiment.

The operation of the circuit of the first embodiment will next be described.

Figure 15:
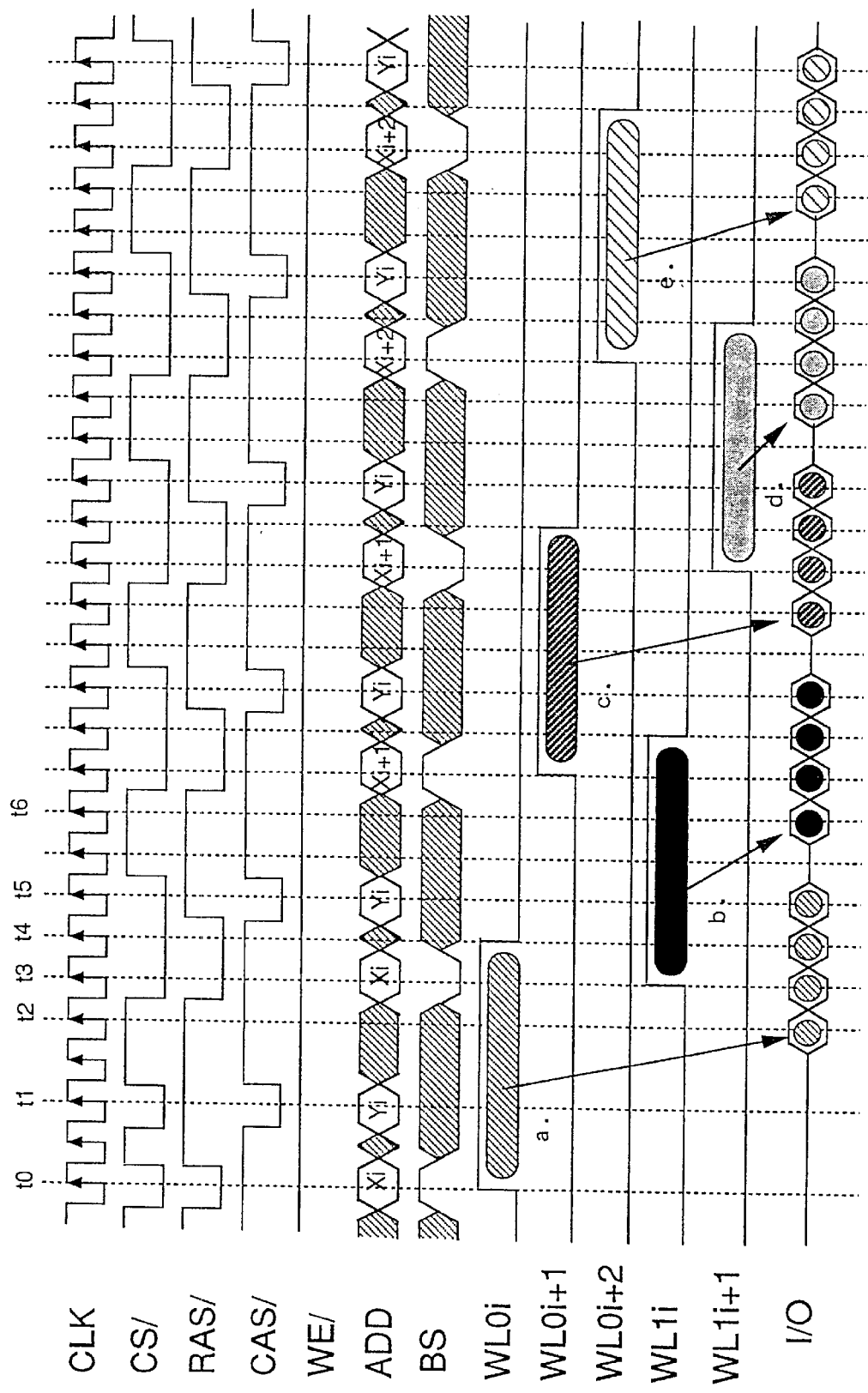
FIG. 15 is a diagram describing the operation of the circuit of the first embodiment.

FIG. 15 is a diagram for describing the operation of the circuit of the first embodiment shown in FIG. 14. How to output data on different word lines by alternately using the two banks will be explained with times.

Time t0:

Since RAS/ and CS/ are low in level, ADD at the time of the leading edge of CLK is captured as an X address Xi in synchronism with the leading edge of CLK. Since BS is low in level at this time, a word line WL0i of the bank-0 is started up.

Time t1:

Since CAS/ and CS/ are low in level, ADD at the time of the leading edge of CLK is captured as a Y address Yi in synchronism with the leading edge of CLK, so that a column line Y0i of the bank-0 is selected.

Time t2:

Data D0i in a memory cell unit selected by WL0i and Y0i is outputted from I/O through a data bus G.

Time t3:

Since RAS/ and CS/ are low in level, ADD at the time of the leading edge of CLK is captured as an X address Xi in synchronism with the leading edge of CLK. Since BS is low in level at this time, a word line WL1i of the bank-1 is started up. An access to the word line WL1i is performed at time t6 or later.

At this time, data D0i+1 in a memory cell unit selected by a column line Y0i+1 in synchronism with leading edge of OLK is transferred to an I/O circuit E through the data bus G and outputted from I/O.

Time t4:

Data D0i+2 in a memory cell unit selected by a column line Y0i+2 in synchronism with the leading edge of CLK is outputted from I/O through the data bus G.

Assuming at this time that RAS/ and CS/ are low in level and CAS/ is high in level, and one address (such as A8 or the like, and when A8 is low in level, the bank-0 enters into a precharge mode, whereas when A8 is high in level, the bank-1 is brought to the precharge mode) previously defined specifically to the device to set the bank to a given one-side precharge mode is low in level although not shown in the drawing in particular, the activated and selected word line WL0i of the bank-0 results in a low level.

Time t5:

Since RAS/ is high in level and CAS/ and CS/ are low in level, ADD at the time of the leading edge of CLK is captured as a Y address Yi in synchronism with the leading edge of CLK and thereby a column line YIi of the bank-1 is selected.

At the same time, data D0i+3 in a memory cell unit selected by a column line Y0i+3 in synchronism with the leading edge of CLK is outputted from I/O through the data bus G.

Time t6:

Data D1i in a memory unit selected by the word line WL1i selected at time t3 and the column line Y1i selected at time t5 is transferred to the I/O circuit G through the data bus G and outputted from I/O.

Figure 16:
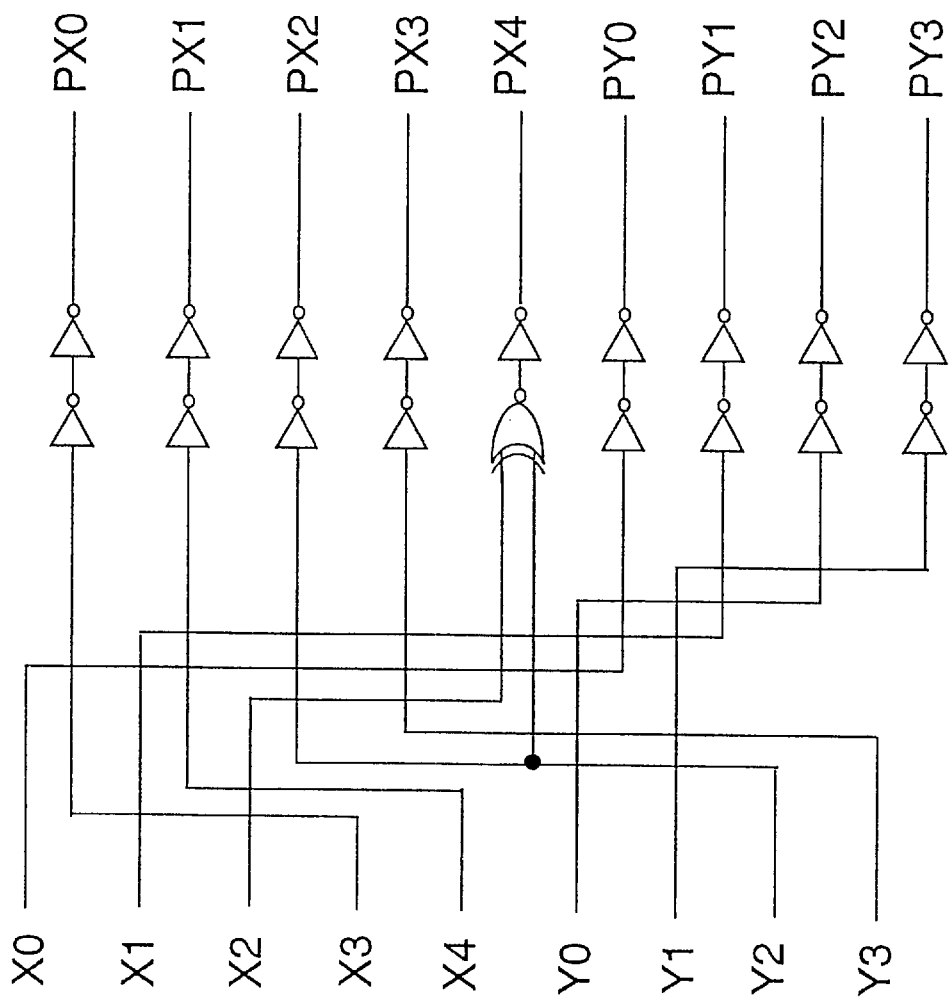
FIG. 16 is a circuit diagram showing an address translator on the assumption that the configuration of each individual bank is employed as in the first embodiment.

FIG. 16 is a diagram showing a circuit example of an address translator on the assumption that the configuration of each individual bank employed in the first embodiment is taken as the example of 4×4 blocks in FIG. 8. The use of the address converter circuit makes it easy to perform address translation employed in the first embodiment of the present invention.

Thus, the first embodiment of the present invention is capable of easily performing address translation for allowing the previously impracticable high-speed serial access in the column direction, on the memory at high speed as well as performing the high-speed serial access in the row direction.

Figure 17:
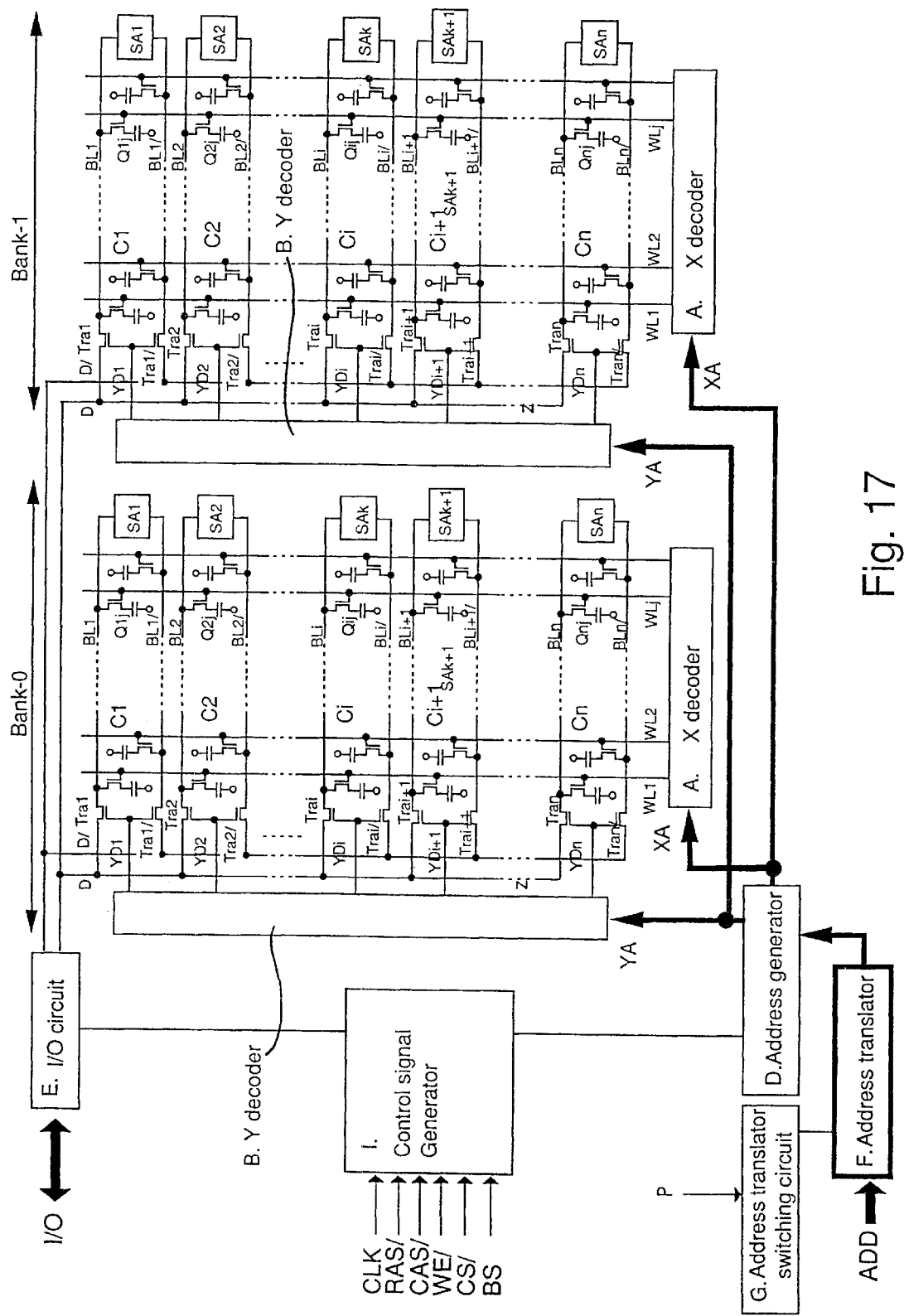
FIG. 17 is a circuit diagram showing a second embodiment of the semiconductor memory device according to the present invention.

FIG. 17 is a circuit diagram showing a second embodiment of a semiconductor memory device according to the present invention.

In the second embodiment, an address translator switching circuit G for receiving an address translator switch signal P therein is added to the first embodiment. The address translator switching circuit G controls an address translator F.

Figure 18:
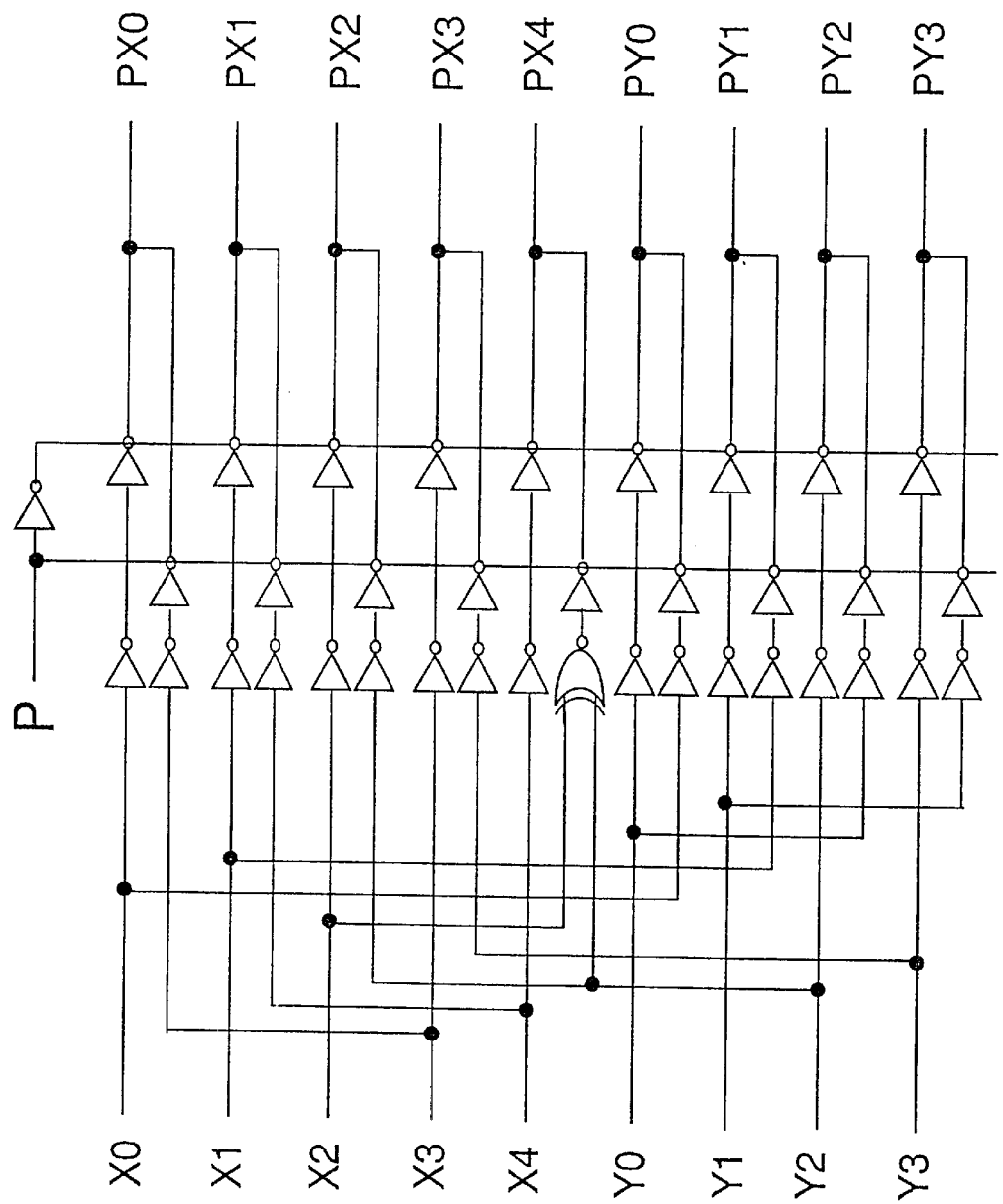
FIG. 18 is a circuit diagram collectively showing the address translator switching circuit and the address translator employed in the second embodiment.

FIG. 18 is a circuit diagram collectively showing the address translator switching circuit and the address translator employed in the second embodiment. When the address translator switch signal P is low in level, input addresses ADD (X0, X1, X2, X3, X4, Y0, Y1, Y2 and Y3) result in internal addresses as they are. However, when the address translator switch signal P is high in level, the input addresses are placed under the control of the address translator illustrated in FIG. 17, which is capable of implementing the present invention.

Similarly to the first embodiment, the second embodiment is capable of easily performing address translation for allowing the previously impracticable high-speed serial access in the column direction, on the memory at high speed as well as being capable of performing the high-speed serial access in the row direction. Further, when the address translator switch signal P is low in level, the second embodiment can provide memory mapping as a memory similar to one used in the prior art.

After the completion of the address translation, switching to address generation is done to convert the input addresses into desired ones. Since data written by the address translation can be outputted in a page mode in the row direction, a block access can be performed with less power consumption.

Figure 19:
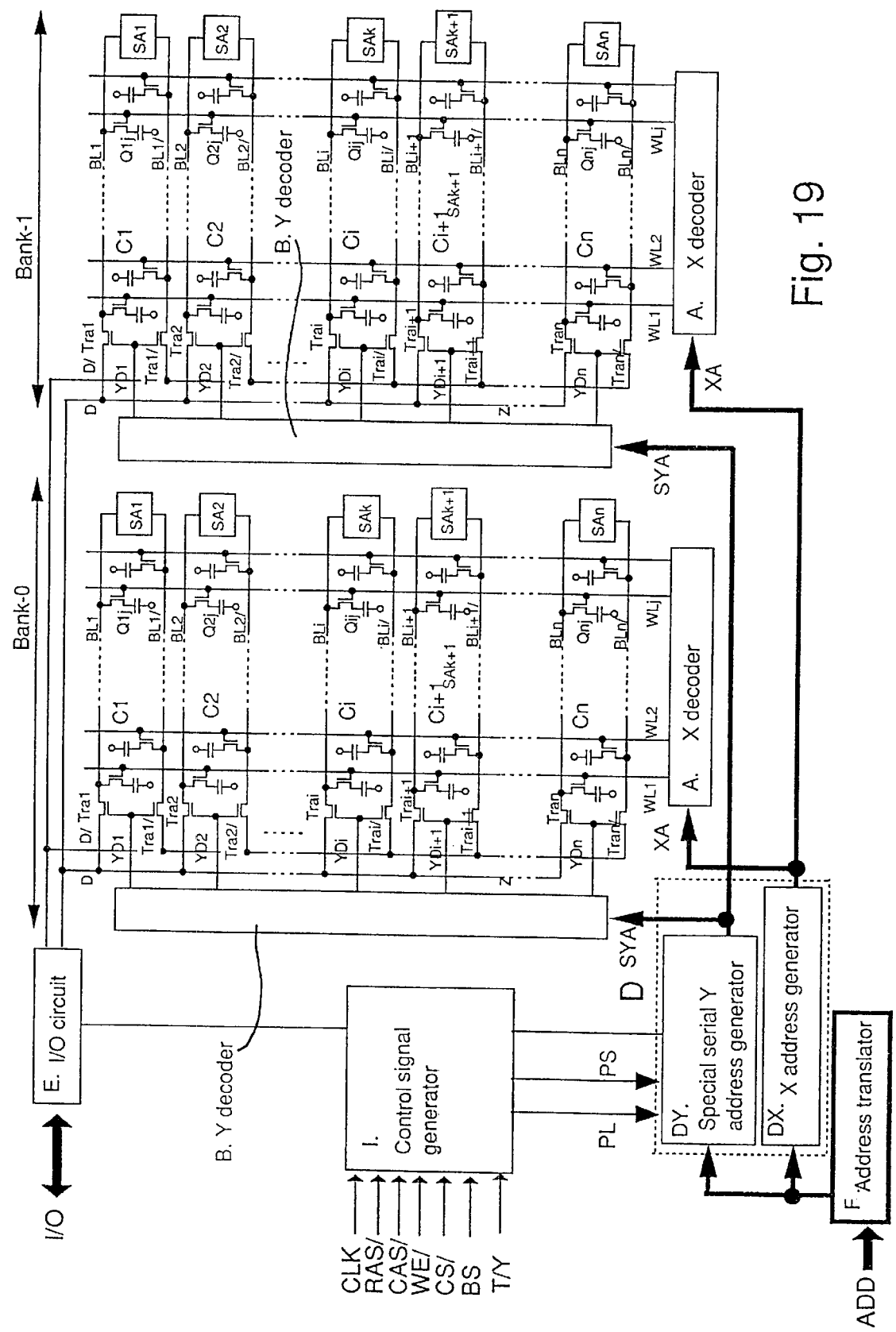
FIG. 19 is a circuit diagram showing a third embodiment of a semiconductor memory device according to the present invention.

FIG. 19 is a circuit diagram showing a third embodiment of a semiconductor memory device according to the present invention.

In the third embodiment as shown in FIG. 19, a special serial Y address generator DY is provided to input a special serial Y address SYA to a Y address decoder B. The special serial Y address generator DY is supplied with signals PL and PS. A control signal generator is supplied with a mode switch signal TN for the special serial Y address generator.

Figure 20:
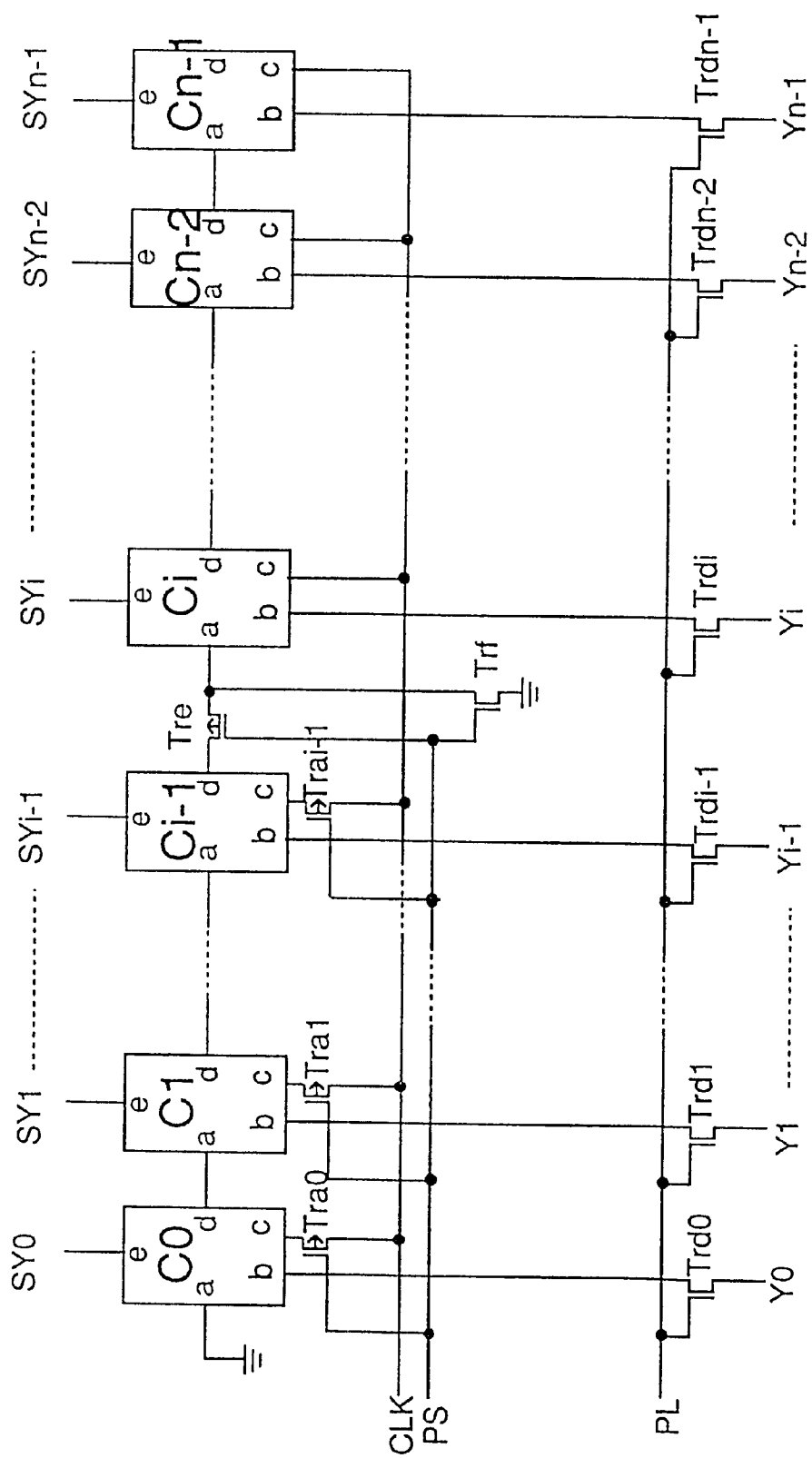
FIG. 20 is a circuit diagram showing a special serial Y address generator employed in the third embodiment.

FIG. 20 is a diagram showing a special serial Y address generator shown in FIG. 19.

Ci (where i=0 to n−1) respectively indicate counter element circuits which constitute address counters for generating serial addresses.

Figure 21:
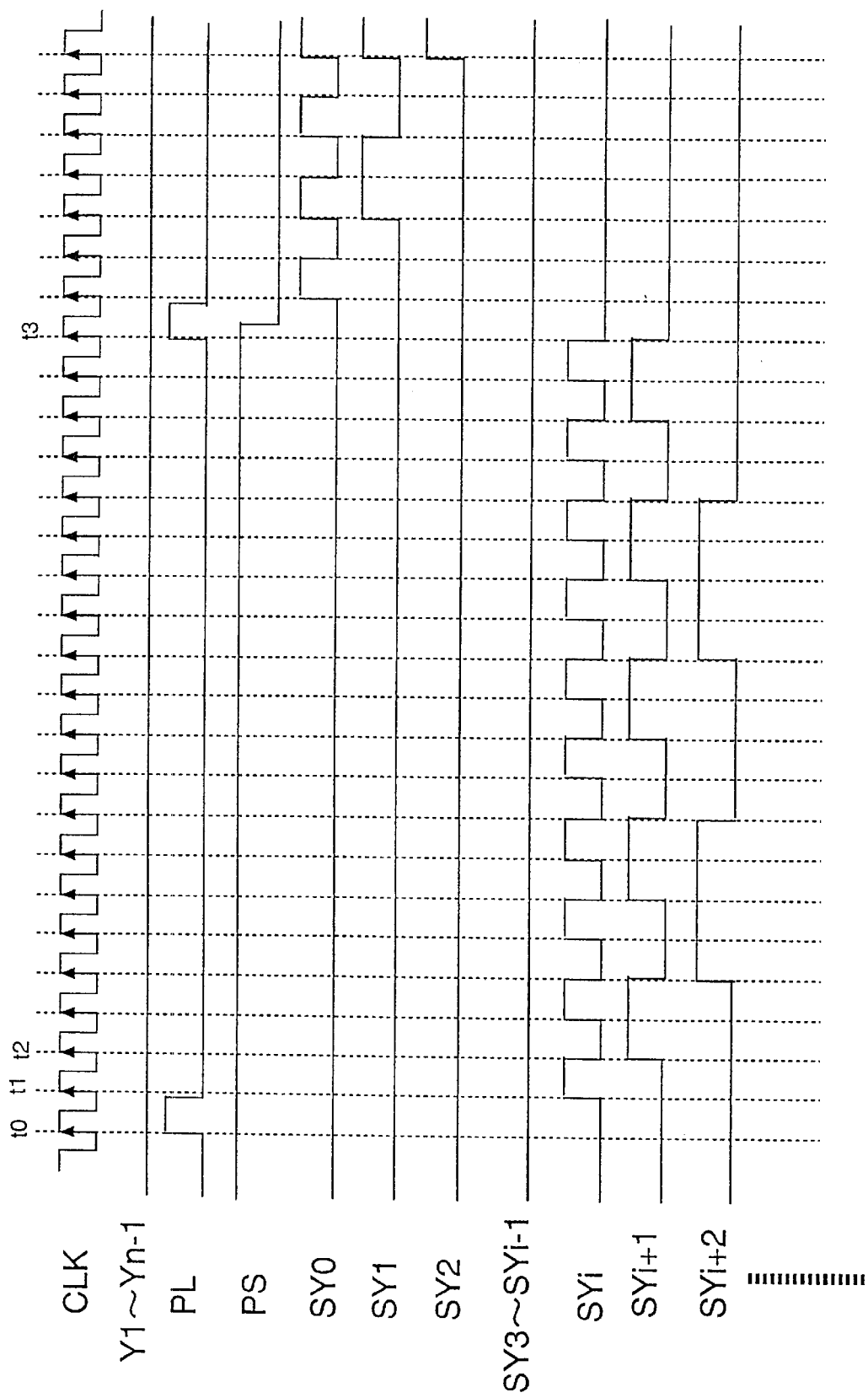
FIG. 21 is a timing chart for describing the operation of the special serial Y address generator.

FIG. 21 is a timing chart for describing the operation of the special serial Y address generator. Let's now assume that input addresses Y0 through Yn−1 are all low in level. The operation of the special serial Y address generator will be explained with time.

Time t0:

The signal PL becomes a high level so that transistors Trd0 through Trdn−1 are turned on. Thus, the input addresses are taken in their corresponding counter element circuits C0 through Cn−1. Y addresses SY0 through SYn−1 are outputted as the input addresses as they are and all rendered low in level. Since the signal PS is high in level at this time (controlled by the mode switch signal T/Y), transistors Tra0 through Trai−1 are turned off, a transistor Tre is also turned off and a transistor Trf is turned on.

Time t1:

Since the PS is high in level even if a clock signal CLK rises, the transistors Tra0 through Trai−1 are turned off and the clock signal CLK is not inputted to the counter element circuits C0 through Ci−1. Thus, the Y addresses SY0 through SYi−1 remain low in level. On the other hand, since the signal PS is high in level and the transistor Trf is in an on condition, a node a of the counter element circuit Ci results in a ground level. Thus, the output SYi of the counter element circuit Ci is brought to a high level in response to the leading edge of the clock signal CLK. Further, the high-order Y addresses SYi+1, SYi+2, . . . remain low in level.

Time t2:

At the next clock, the Y address SYi goes low and the Y address SYi+1 goes high.

Figure 24:
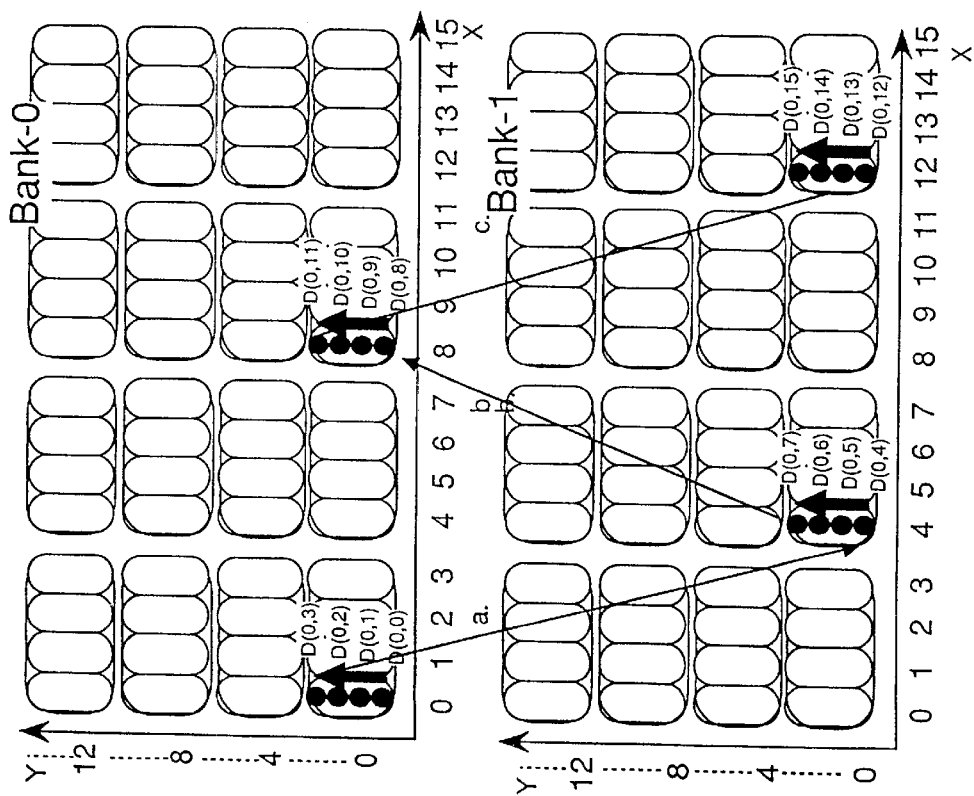
FIG. 24 shows the order of serially accessing bits on a line of X=0 in the address map of the memory shown in FIG. 23.

Up to time t3:

As shown in FIG. 24, the counter element circuits Ci through Cn−1 serve as address counters respectively and the Y addresses SYi through SYn−1 indicative of their outputs are generated as serial addresses in synchronism with the leading edge of the clock signal CLK. Since the signal PS is high in level, the counter element circuits C0 through Ci−1 are not supplied with the clock signal CLK and thereby their outputs remain unchanged.

Time t3:

The signal PL goes high in level so that the transistors Trd0 through Trdn−1 are turned on. Thus, the input addresses are brought into the counter element circuits C0 through Cn−1. The Y addresses SY0 through SYn−1 are outputted as the input addresses as they are and all of them go low in level. Immediately after such a state, the signal PS is rendered low in level. At this time, the transistors Tra0 through Trai−1 are turned on, the transistor Tre is also turned on and the transistor Trf is turned off. At this time, the counter element circuits C0 through Cn−1 serve as a series of address counters.

Subsequent to time t4:

Under the same operation as that taken up to time t0 to time t3, the counter element circuits C0 through Cn−1 function as a series of address counters for counting up the clock signal CLK to thereby generate incremental addresses as shown in FIG. 21.

In regard to how to write data into and read same from the memory according to the third embodiment, the serial access operation of the Y decoder is classified into two types. One of the two types corresponds to a case in which when a serial access in a row direction is performed, the least significant address of high-order addresses serves as if to work as an Y address "0" while the low-order Y addresses shown in FIGS. 4 through 6 are being fixed, and the high-order addresses are incremented for the clock signal. On the other hand, another one thereof corresponds to a case in which when a serial access in a column direction is done, the least significant Y address "0" to the most significant Y address serve as a series of counters as in the case of the execution of the serial access shown in FIG. 7.

The addresses may be generated outside to execute the serial access. It is however necessary to provide an address generator capable of performing a higher-speed serial access. The special serial Y address generator shown in FIG. 20 may be used for the aforementioned two types of high-speed serial Y address generations.

Namely, when the signal PS is high in level as indicated at time t0 to t3 in FIG. 21, the low-order Y addresses are kept at their levels as they are even if the clock signal CLK is inputted (while the low-order Y addresses inputted as the initial values are all low in level in the present embodiment, any address may be inputted as the initial values in practice). In the high-order Y address counters, the high-order Y addresses serve so as to generate serial addresses incremental for the clock signal CLK as if the counter element circuits Ci were brought to the least significant address counters, whereby the Y decoder operations shown in FIGS. 4 through 6 are allowed.

When the signal PS is low in level as indicated at time t3 or later in FIG. 21, an incremental serial address is generated with C0 as the least significant Y address counter, so that the serial access shown in FIG. 7 can be performed.

Thus, since the special serial Y address generator is provided in the third embodiment, the higher-speed serial access in the row direction and the similar-speed serial access in the column direction can be performed.

Figure 22:
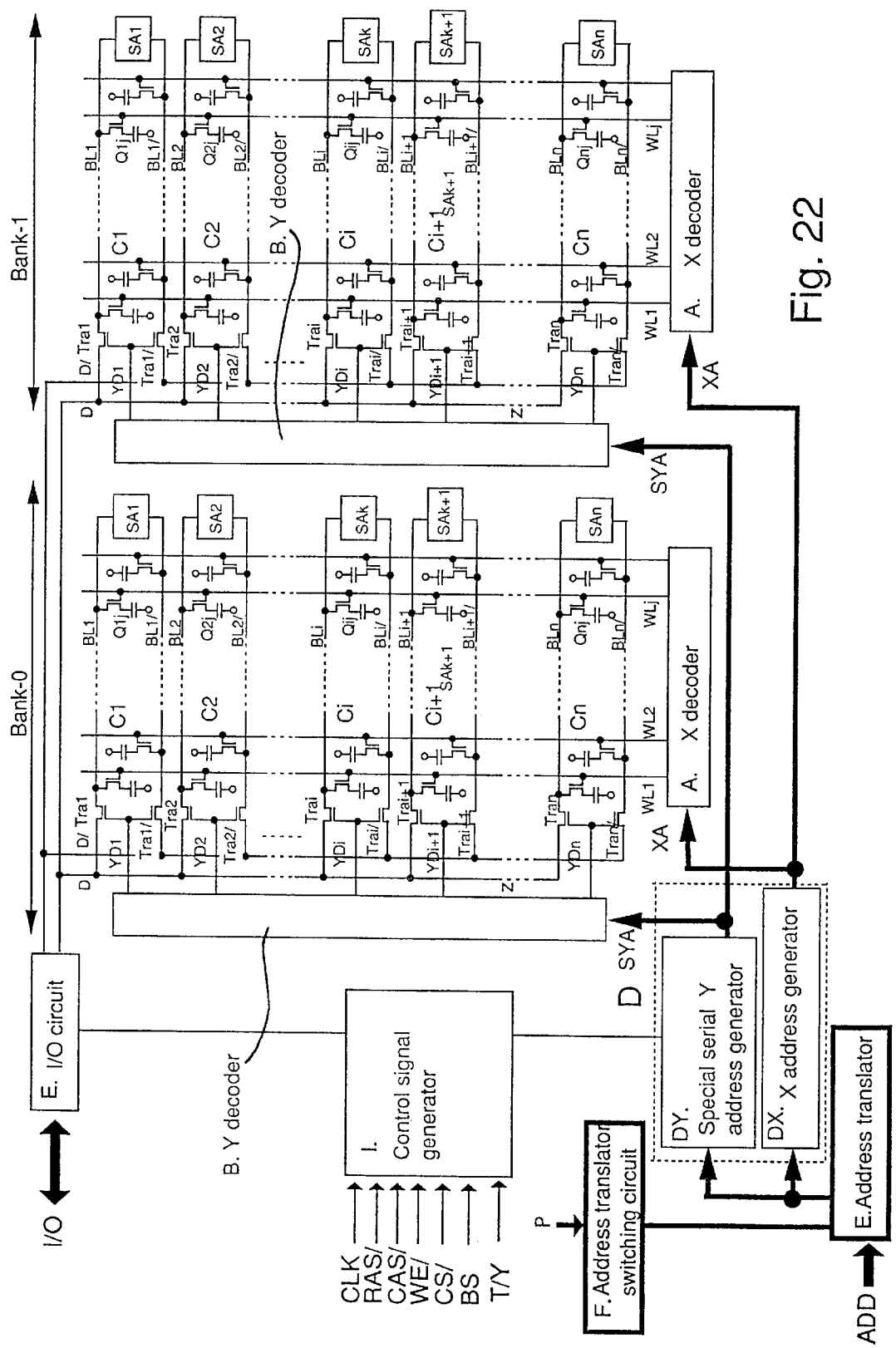
FIG. 22 is a circuit diagram showing a fourth embodiment of a semiconductor memory device according to the present invention.

FIG. 22 is a circuit diagram showing a fourth embodiment of a semiconductor memory device according to the present invention.

The fourth embodiment shows one in which the address translator switching circuit F illustrated in the second embodiment is added to the third embodiment.

While a high-speed serial access in a row direction can be performed in the fourth embodiment, address translation for allowing the previously-impracticable high-speed serial access in the column direction can be easily performed on a memory at high speed and the conventional addresses are generated to enable a memory access. Therefore, the semiconductor memory device according to the present embodiment can perform memory mapping as the conventional memory.

After the completion of the address translation, switching to address generation is done to convert input addresses into desired ones. Since data written by the address translation can be outputted in a page mode in the row direction, a block access can be performed with less power consumption.

Further, since a special serial Y address generator is provided, a higher-speed row-direction serial access and a similar-speed column-direction serial access can be achieved.

Although the method of arranging the data in the two-bank memory having 4×4 blocks per bank, according to the first embodiment of the present invention is illustrated in simplified form, a method of re-arranging memory data on the same X addresses as those shown in FIG. 8 in just the same idea will be illustrated as the method according to the second embodiment of the present invention.

Figure 26:
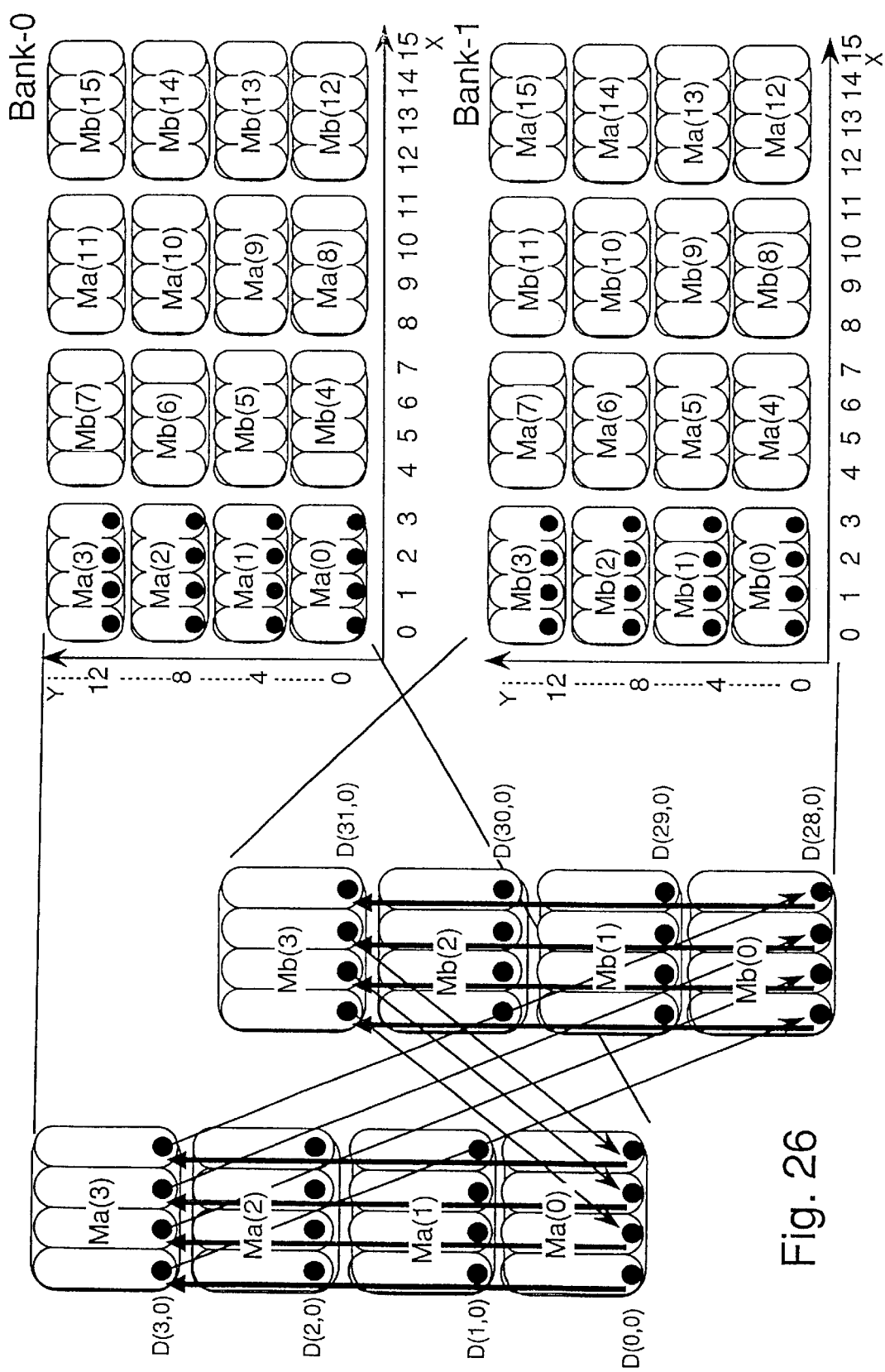
FIG. 26 is a diagram showing the method according to the second embodiment of the present invention as an example of 4×4 blocks.

FIG. 26 is a diagram showing the method according to the second embodiment of the present invention as an example of 4×4 blocks.

The method according to the second embodiment can obtain substantially the same advantageous effects (capable of implementing a high-speed serial access in a row direction and a high-speed serial access in a column direction) as those obtained by the method according to the first embodiment.

Figure 23:
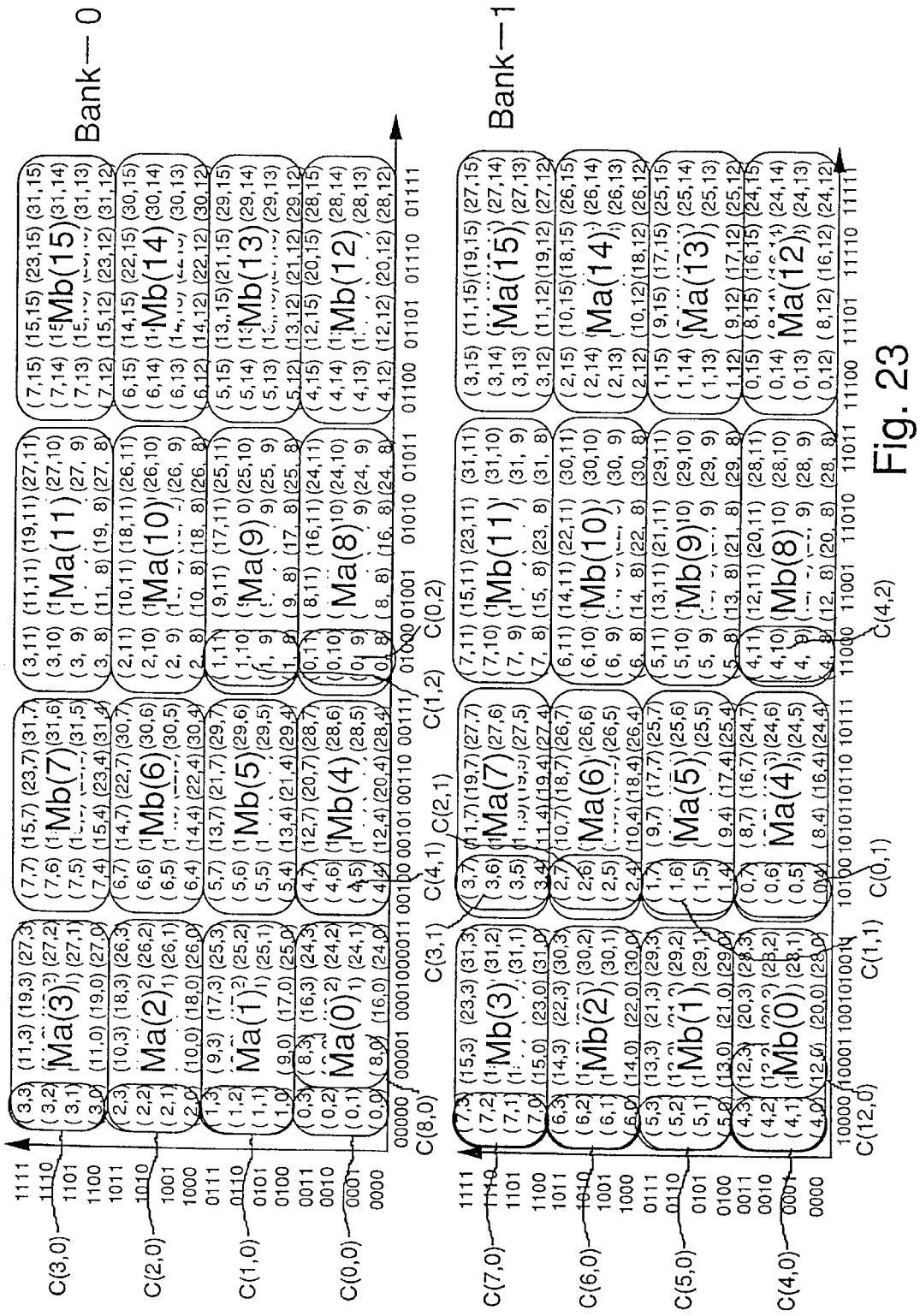
FIG. 23 is a diagram showing a memory map having a capacity of 512 bits.

Namely, data on the same X addresses as those in the memory shown in FIG. 8 are re-arranged in the order of reducing or decreasing X addresses (i of D(i, j)) of data as a collection or set of data having continuous Y addresses as shown in FIG. 23. A description will be made of an example of X=0 in FIG. 23. Namely, items of data are re-arranged in the order of D(0, 0), D(0, 1), D(0, 2), D(0, 3), D(1, 0), D(1, 1), D(1, 2), . . . .

Figure 25:
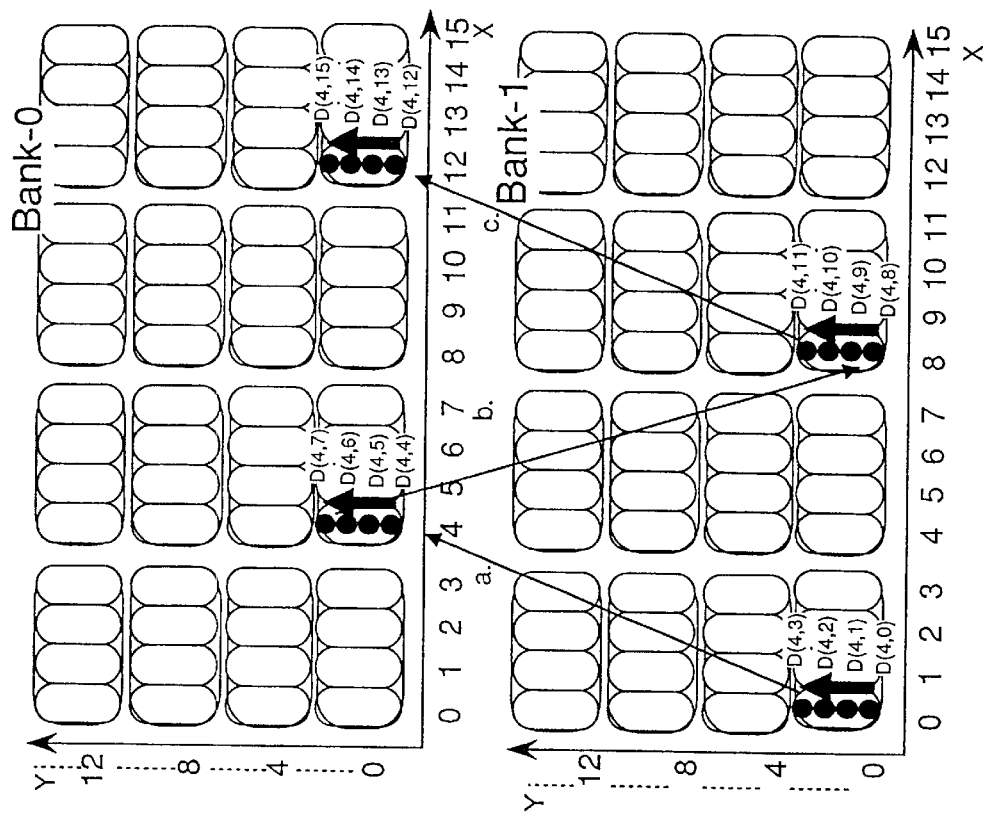
FIG. 25 shows the order of serially accessing bits on a line of X=4 in the address map of the memory shown in FIG. 23.

The serial access (row page access) in the row direction will next be explained with reference to FIGS. 24 and 25.

FIG. 24 shows the order of serially accessing bits on a line of X=0 in the address map of the memory shown in FIG. 23. The leading bit to be serially accessed will be defined as D(0, 0). An access to the leading bit D(0, 0) in C(0, 0) of Ma(0) is started and data having continuous Y addresses in C(0, 0) are successively accessed. During that time, a bank-1 is ready for a continuous access following the selection of a word line of X=4 in the bank-1.

After the completion of the access to D(0, 3), D(0, 4) in C(0, 1) of Ma(4) is accessed. Further, data having continuous Y addresses in C(0, 1) are successively accessed. During that time, the bank-0 is ready for a continuous access following the selection of a word line of X=8 in the bank-0.

Carrying out the above operations in accordance with arrows shown in FIG. 24 makes it possible to serially access D(0, 0) to D(0, 15) in the row direction of X=0 in FIG. 23. FIG. 25 shows an example in which D(4, 0) to D(4, 15) are serially accessed in the row direction of X=4 in FIG. 23.

FIG. 26 is a diagram showing a method of executing a serial access in a column direction of Y=0 in FIG. 23.

D(0, 0) through D(3, 0) of Ma(0) through Ma(3) in a bank-0 are accessed in order of arrows. During that time, X addresses and a row of X=0 in a bank-1 are activated to make preparations for the following serial access.

After the completion of the access to D(3, 0), D(4, 0) through D(7, 0) of Mb(0) through Mb(3) in the bank-1 are accessed in order of arrows. During that time, X addresses and a row of X=1 in the bank-0 are activated to make preparations for the following serial access.

The implementation of the above operations in accordance with arrows shown in FIG. 26 allows a serial access to D(0, 0) to D(31, 0) in the column direction of Y=0 in FIG. 23.

As has been described above in detail, the semiconductor memory device according to the present invention, the method of reading the data from and writing same to the semiconductor memory device and the high-speed serial access in the row direction can be achieved. Further, the address translation for allowing the conventionally-impracticable high-speed serial access in the column direction can be easily effected on the memory at high speed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device comprising:
a single synchronous dynamic random access memory having first and second memory banks, each of the first and second memory banks including a Y decoder, an X decoder, and a memory cell array having a plurality of X lines each including a plurality of memory cells;
a control signal generator outputting control signals;
an input/output circuit coupled to the memory cell arrays of the memory banks and said control signal generator;
an address generator coupled to the X decoders and Y decoders of said memory banks and said control signal generator, said address generator outputting X and Y addresses to the X decoders and Y decoders in response to the control signals; and
an address translator coupled to the address generator, said address translator receiving an address signal and translating the address signal to a predetermined address so that a plurality of serial line data of matrix data serially inputted into the semiconductor memory device are divided into continuous data sets each having a predetermined number of continuous data representing plural pixels, and so that the continuous data sets are located on a first area including $(2n-1)$th X lines of the first bank and $2n$th X lines of the second bank, and a second area including $(2n-1)$th X lines of the second bank and $2n$th X lines of the first bank in turn, where n is a natural number.

2. The semiconductor memory device according to claim 1, further comprising an address translator switching circuit coupled to said address translator, said address translator switching circuit outputting a switching signal to said address translator so that said address translator outputs the address signal or the predetermined address in response to the switching signal.

3. The semiconductor memory device according to claim 1, wherein said address generator has a special serial Y address generator coupled to the Y decoders of the memory banks and an X address generator coupled to the X decoders of the memory banks, the special Y address generator fixes a low-order Y address and increments a high-order Y address during a row direction serial access mode, and the special Y address generator increments a Y address during a column direction serial access mode.

4. The semiconductor memory device according to claim 3, further comprising an address translator switching circuit, said address translator switching circuit outputting a switching signal to said address translator so that said address translator outputs the address signal or the predetermined address in response to the switching signal.

5. A method of accessing matrix data in a semiconductor memory device, the semiconductor memory device including a single synchronous dynamic random access memory having first and second memory banks, the matrix data including a plurality of serial line data, each of the banks having a plurality of X lines including a plurality of memory cells, the method comprising:
dividing the serial line data into continuous data sets each having a predetermined number of continuous data representing plural pixels; and
serially accessing the continuous data sets to a first area including $(2n-1)$th X lines of the first bank and $2n$th X lines of the second bank, and a second area including $(2n-1)$th X lines of the second bank and $2n$th X lines of the first bank in turn, where n is a natural number.

6. A method of accessing matrix data in a semiconductor memory device according to claim 5, wherein the continuous data sets of each of the serial line data include even number data sets and odd number data sets, and the even number data sets are located in the first area and the odd number data sets are located in the second area.

7. A method of accessing matrix data stored in a semiconductor memory device, the semiconductor memory device including a single synchronous dynamic random access memory having first and second memory banks each having a plurality of X lines including a plurality of memory cells, the matrix data including a plurality of serial line data divided into continuous data sets each having a predetermined number of continuous data representing plural pixels, the continuous data sets are located to a first area including $(2n-1)$th lines of the first bank and $2n$th X lines of the second bank, and a second area including $(2n-1)$th X lines of the second bank and $2n$th X lines of the first bank in turn, where n is a natural number, the method comprising:
serially accessing data located on the $(2n-1)$th X line of the first bank; preparing the $2n$th X line of the second bank during the access of the $(2n-1)$th X line of the first bank;
serially accessing data located on the $2n$th X line of the second bank; and preparing the $(2n-1)$th X line of the first bank during the access of the $2n$th X lines of the second bank.

8. The semiconductor memory device according to claim 1, wherein the continuous data sets are located in every mth memory cells on the $(2n-1)$th X lines of the first bank, on the $2n$th X lines of the second bank, on the $(2n-1)$th X lines of the second bank and on the $2n$th X lines of the first bank, where m is a natural number.

9. The semiconductor memory device according to claim 1, wherein the continuous data sets are located in continuous m memory cells on the $(2n-1)$th X lines of the first bank, on the $2n$th X lines of the second bank, on the $(2n-1)$th X lines of the second bank and on the $2n$th X lines of the first bank, where m is a natural number.

10. The method of accessing matrix data according to claim 5, wherein the continuous data sets are accessed in every mth memory cells on the $(2n-1)$th X lines of the first bank, on the $2n$th X lines of the second bank, on the $(2n-1)$th X lines of the second bank and on the $2n$th X lines of the first bank, where m is a natural number.

11. The method of accessing matrix data according to claim 5, wherein the continuous data sets are accessed in continuous m memory cells on the $(2n-1)$th X lines of the first bank, on the $2n$th X lines of the second bank, on the $(2n-1)$th X lines of the second bank and on the $2n$th X lines of the first bank, where m is a natural number.

12. The method of accessing matrix data according to claim 7, wherein the continuous data sets are located in every mth memory cells on the $(2n-1)$th X lines of the first bank, on the $2n$th X lines of the second bank, on the $(2n-1)$th X lines of the second bank and on the $2n$th X lines of the first bank, where m is a natural number.

13. The method of accessing matrix data according to claim 12, wherein said serially accessing respectively comprise serially accessing every mth memory cells on the $(2n-1)$th X line of the first bank and serially accessing every mth memory cells on the $2n$th X line of the second bank.

14. The method of accessing matrix data according to claim 7, wherein the continuous data sets are located in continuous m memory cells on the $(2n-1)$th X lines of the first bank, on the 2 nth X lines of the second bank, on the $(2n-1)$th X lines of the second bank and on the $2n$th X lines of the first bank, where m is a natural number.

15. The method of accessing matrix data according to claim 14, wherein said serially accessing respectively comprise serially accessing continuous m memory cells on the $(2n-1)$th X line of the first bank and serially accessing continuous m memory cells on the $2n$th X lines of the second bank.

* * * * *